(12) United States Patent
Tanaka

(10) Patent No.: US 9,620,931 B2
(45) Date of Patent: Apr. 11, 2017

(54) OPTICAL DEVICE, OPTICAL TRANSMISSION DEVICE, OPTICAL RECEPTION DEVICE, HYBRID LASER AND OPTICAL TRANSMISSION APPARATUS

(71) Applicant: FUJITSU LIMITED, Kawasaki-shi, Kanagawa (JP)

(72) Inventor: Shinsuke Tanaka, Hiratsuka (JP)

(73) Assignee: FUJITSU LIMITED, Kawasaki (JP)

(*) Notice: Subject to any disclaimer, the term of this patent is extended or adjusted under 35 U.S.C. 154(b) by 19 days.

(21) Appl. No.: 14/470,553

(22) Filed: Aug. 27, 2014

(65) Prior Publication Data

US 2015/0303653 A1 Oct. 22, 2015

Related U.S. Application Data

(63) Continuation of application No. PCT/JP2012/058635, filed on Mar. 20, 2012.

(51) Int. Cl.
*H01S 5/10* (2006.01)
*G02B 6/12* (2006.01)
(Continued)

(52) U.S. Cl.
CPC .......... *H01S 5/1014* (2013.01); *G02B 6/124* (2013.01); *G02B 6/12004* (2013.01); *G02B 6/1228* (2013.01); *H01S 5/0078* (2013.01); *H01S 5/1028* (2013.01); *H01S 5/125* (2013.01); *H01S 5/3031* (2013.01); *H04B 10/501* (2013.01);
(Continued)

(58) Field of Classification Search
CPC ............ H01S 5/1014; G02B 6/1228; G02B 2006/12152
See application file for complete search history.

(56) References Cited

U.S. PATENT DOCUMENTS 6,363,188 B1 * 3/2002 Alphonse .......... G02B 6/02057
385/123
7,013,067 B2 * 3/2006 Ghiron ................ G02B 6/4204
385/39

(Continued)

FOREIGN PATENT DOCUMENTS

| JP | 01-302304 | 12/1989 |
|----|-----------|---------|
| JP | 2006-245344 | 9/2006 |
| JP | 2010-044290 | 2/2010 |

OTHER PUBLICATIONS

Tsuchizawa et al., "Microphotonics Devices Based on Silicon Microfabrication Technology", IEEE Journal of Selected Topics in Quantum Electronics, vol. 11, No. 1, Jan./Feb. 2005 (pp. 232-240).

(Continued)

*Primary Examiner* — Michelle R Connelly
(74) *Attorney, Agent, or Firm* — Fujitsu Patent Center

(57) ABSTRACT

An optical device includes a silicon waveguide core having a tapered portion having a sectional size that decreases toward a terminal end portion thereof, a dielectric waveguide core contiguous to the silicon waveguide core while covering at least the tapered portion, the dielectric waveguide core having a refractive index lower than that of the silicon waveguide core and configuring a single-mode waveguide, and a diffraction grating provided at the single-mode waveguide and configuring a distributed Bragg reflection mirror.

17 Claims, 20 Drawing Sheets

(51) Int. Cl.
    *G02B 6/124*     (2006.01)
    *G02B 6/34*     (2006.01)
    *G02B 6/122*     (2006.01)
    *H01S 5/00*     (2006.01)
    *H01S 5/125*     (2006.01)
    *H01S 5/30*     (2006.01)
    *H04B 10/50*     (2013.01)
    *H04B 10/60*     (2013.01)
    *H01S 5/14*     (2006.01)

(52) U.S. Cl.
    CPC ... H04B 10/60 (2013.01); *G02B 2006/12038* (2013.01); *G02B 2006/12061* (2013.01); *G02B 2006/12104* (2013.01); *G02B 2006/12109* (2013.01); *G02B 2006/12147* (2013.01); *H01S 5/1032* (2013.01); *H01S 5/141* (2013.01); *H01S 5/142* (2013.01)

(56) References Cited

U.S. PATENT DOCUMENTS

| | | | |
|---|---|---|---|
| 8,625,942 B2 * | 1/2014 | Na | G01M 11/00 385/14 |
| 9,028,157 B2 * | 5/2015 | Na | G02B 6/12 385/37 |
| 2006/0198416 A1 | 9/2006 | Yamazaki | |
| 2014/0205234 A1 * | 7/2014 | Rong | G02B 6/4201 385/28 |

OTHER PUBLICATIONS

Shoji et al., "Optical Interconnecting Structure of Si Waveguide on SOI Substrate", Japan Society of Applied Physics and Related Societies, (The 48th Spring Meeting, 2001) (3 pages).

Jeong et al., "Silicon-Wire External Cavity Laser for Realizing Temperature Control Free Optical Transmitter", The Institute of Electronics, Information and Communication Engineers (Dec. 2011), (6 pages).

International Search Report, mailed in connection with PCT/JP2012/058635 and mailed Apr. 24, 2012.

* cited by examiner

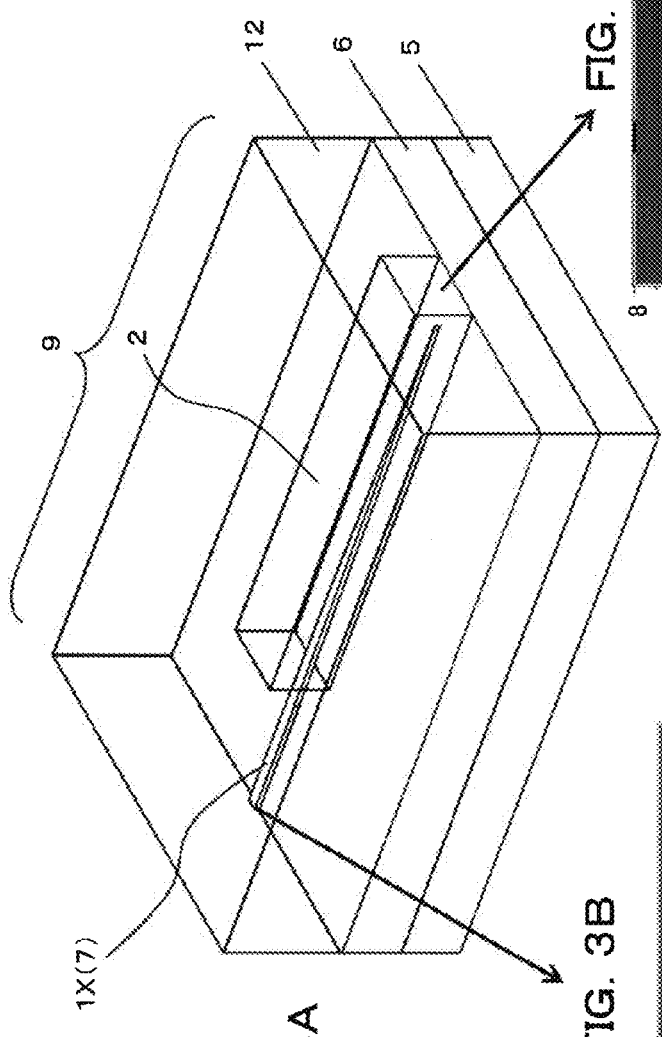
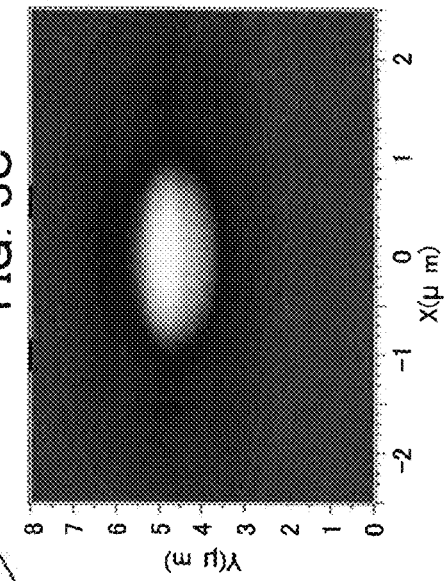
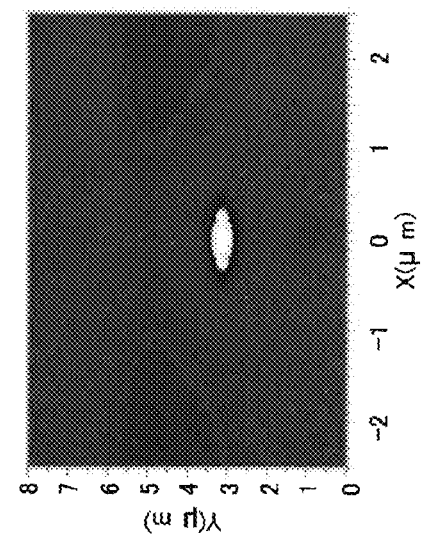

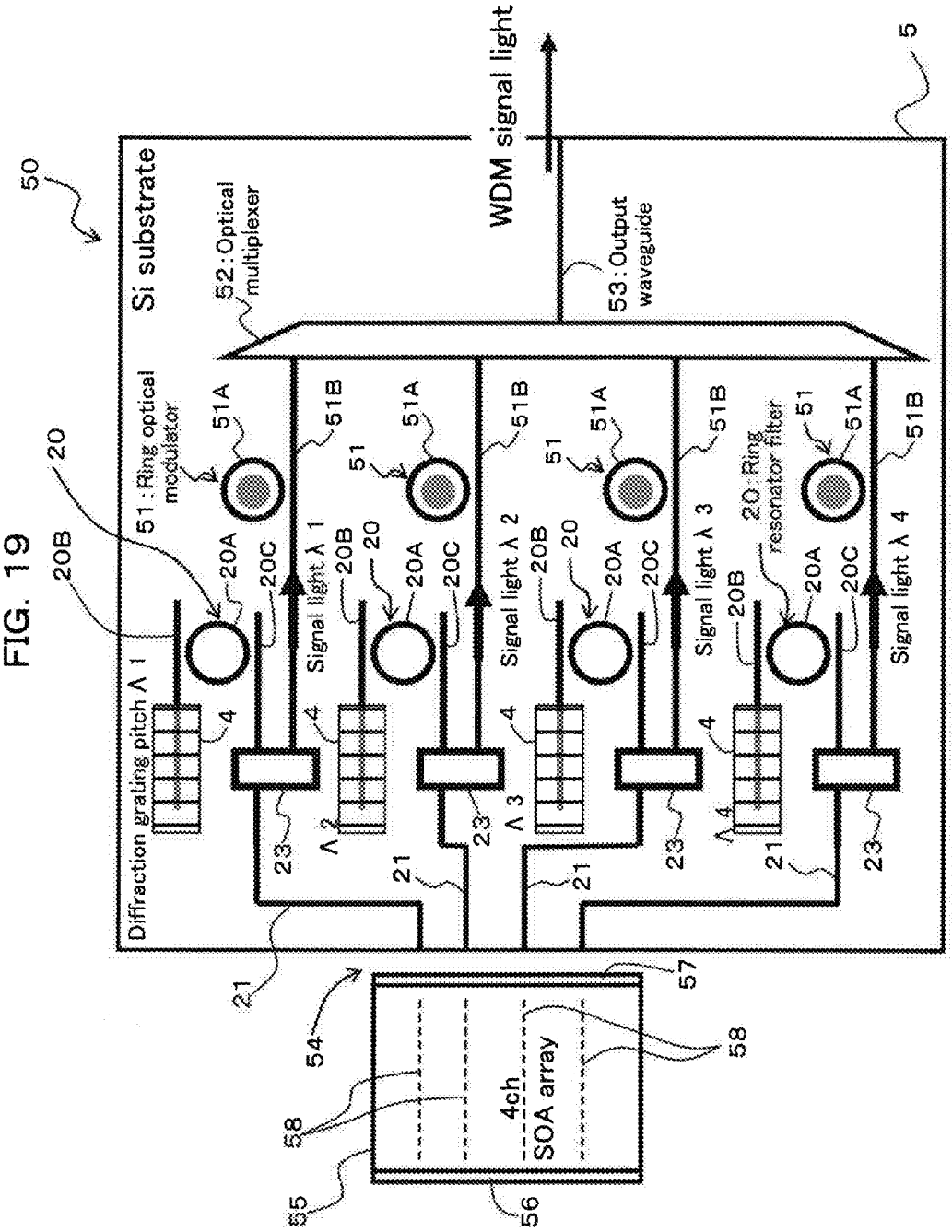

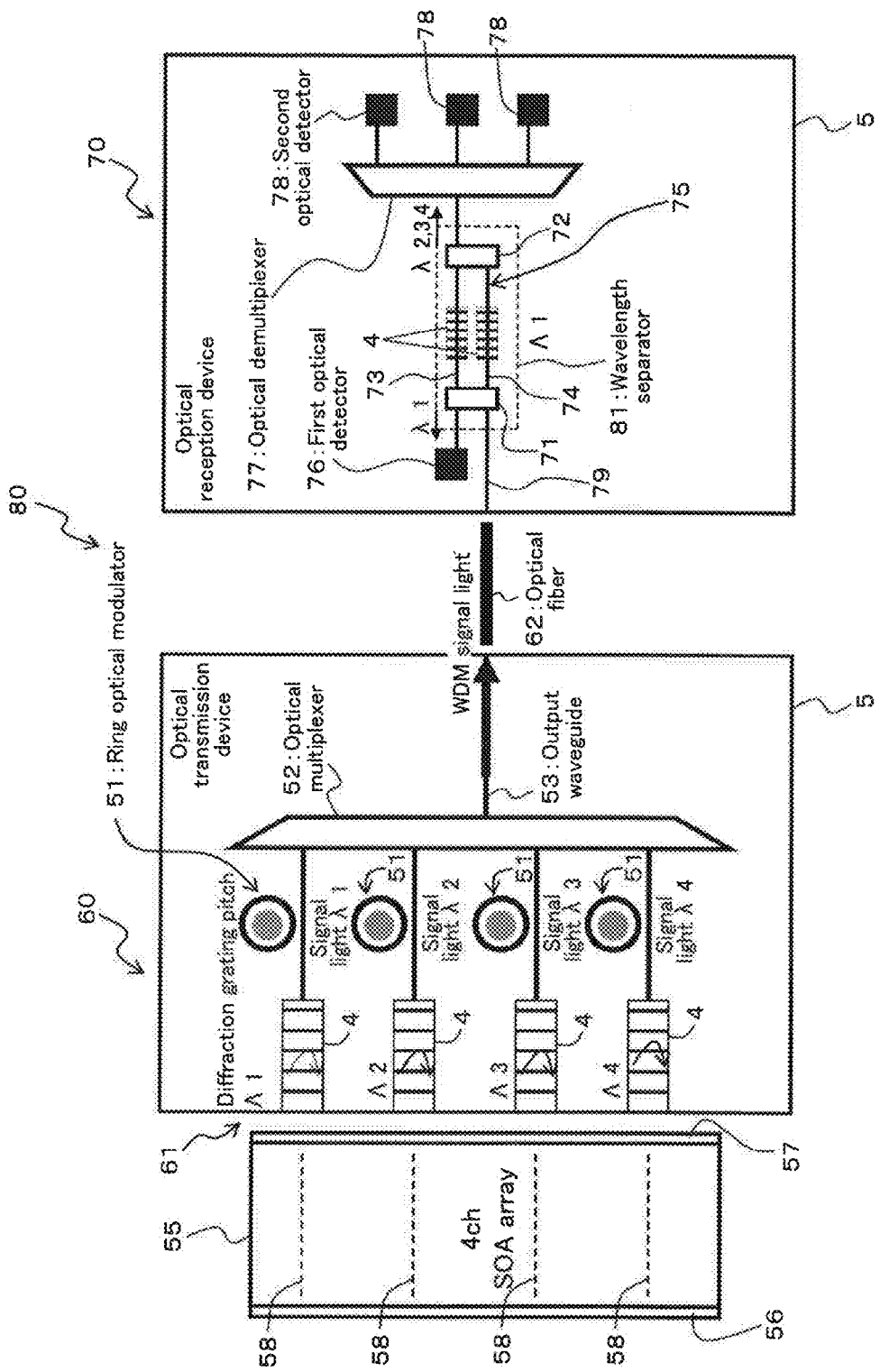

US 9,620,931 B2

OPTICAL DEVICE, OPTICAL TRANSMISSION DEVICE, OPTICAL RECEPTION DEVICE, HYBRID LASER AND OPTICAL TRANSMISSION APPARATUS

CROSS-REFERENCE TO RELATED APPLICATION

This application is a continuation application of International Application PCT/JP2012/058635, filed on Mar. 30, 2012 and designated the U.S., the entire contents of which are incorporated herein by reference.

FIELD

The embodiments discussed herein are related to an optical device, an optical transmission device, an optical reception device, a hybrid laser and an optical transmission apparatus.

BACKGROUND

In recent years, attention is paid to a silicon optical device formed on a silicon substrate utilizing a silicon electronic circuit fabrication technology capable of implementing large-scale integration at a low cost.

For example, in order to solve the problem of shortage of the communication capacity between chips and between boards predicted in the future from improvement of the performance of an information processing equipment such as a high-performance server, a supercomputer or a personal computer, it is expected to implement a large-scale silicon optical communication device based on a low-loss small-size silicon wire waveguide.

Especially, in order to increase the transmission capacity, it is expected to implement a WDM silicon optical communication device to which a wavelength division multiplexing (WDM) transmission system used for optical fiber communication is applied and which multiplexes a plurality of signal lights having independently modulated wavelengths different from each other in a device and transfers the multiplexed signal lights. Since the WDM silicon optical communication device can multiplex and transmit a plurality of signal lights having wavelengths different from each other into a single transmission path, the transmission capacity (communication capacity) per one transmission path increases significantly and an optical communication device having a smaller size and a greater capacity can be implemented.

It is to be noted that a technology relating to a hybrid laser configured by combining a light emitting device such as a semiconductor optical amplifier (SOA) and a silicon optical device and another technology that converts the spot size by a silicon optical device are available.

SUMMARY

According to an aspect of the embodiment, an optical device includes a silicon waveguide core having a tapered portion having a sectional size that decreases toward a terminal end portion thereof, a dielectric waveguide core contiguous to the silicon waveguide core while covering at least the tapered portion, the dielectric waveguide core having a refractive index lower than that of the silicon waveguide core and configuring a single-mode waveguide, and a diffraction grating provided at the single-mode waveguide and configuring a distributed Bragg reflection mirror.

According to an aspect of the embodiment, a hybrid laser includes an optical device that includes, in addition to the components of the optical device described above, a ring resonator filter coupled to a silicon waveguide configured from the silicon waveguide core, a gain medium optically coupled to the optical device, and a reflection mirror provided at the opposite side to the distributed Bragg reflection mirror across the silicon waveguide, ring resonator filter and gain medium and configuring a laser cavity.

According to an aspect of the embodiment, a hybrid laser includes the optical device described above, a gain medium optically coupled to the optical device, and a reflection mirror provided at the opposite side to the distributed Bragg reflection mirror across the gain medium and configuring a laser cavity.

According to an aspect of the embodiment, an optical transmission device includes a plurality of optical devices described above, a plurality of ring optical modulators coupled one by one to the plurality of optical devices, an optical multiplexer coupled to each of the plurality of ring optical modulators, and an output waveguide coupled to the optical multiplexer.

According to an aspect of the embodiment, an optical reception device includes a Mach-Zehnder interferometer having two arms between two optical couplers, the optical device according to claim 11 provided at each of the two arms, a first optical detector coupled to one of the two optical couplers, an optical demultiplexer coupled to the other one of the two optical couplers, and a second optical detector coupled to the optical demultiplexer.

According to an aspect of the embodiment, an optical transmission apparatus includes the optical transmission device described above, a gain medium array optically coupled to the optical transmission device and including a plurality of gain mediums, and a reflection mirror provided at the opposite side to the plurality of distributed Bragg reflection mirrors provided at the optical transmission device across the gain medium array, the reflection mirror configuring a laser cavity.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 3A is a schematic perspective view depicting only a cutout region in the proximity of a transition region of the optical device according to the first embodiment in order to illustrate a shape variation of an optical mode distribution in the transition region, FIG. 3B is a view depicting the optical mode distribution at the input side (silicon waveguide) and FIG. 3C is a view depicting an optical mode distribution at the output side (dielectric waveguide);

FIG. 19 is a schematic top plan view depicting a configuration of an optical transmission device and an optical transmission apparatus according to a third embodiment; and FIG. 20 is a schematic top plan view depicting a configuration of an optical transmission device and an optical transmission apparatus according to a modification to the third embodiment, a configuration of a hybrid laser according to the third embodiment and a configuration of an optical reception device according to the third embodiment.

DESCRIPTION OF EMBODIMENTS

Incidentally, a silicon optical device that includes a diffraction grating configuring a distributed Bragg reflection mirror need to be implemented, for example, in such a case that a silicon optical communication device such as a hybrid laser or a WDM silicon optical communication device is to be implemented.

In this case, it seems a possible idea to periodically vary the width of the silicon waveguide core to form a diffraction grating from a portion of the silicon waveguide core projecting from a side face of the silicon waveguide core.

However, since the silicon waveguide core has a very great difference in refractive index from a cladding and has across section of a very small size, if the dimension of the silicon waveguide core is displaced even a little, then the equivalent refractive index of the waveguide varies by a great amount. As a result, also the Bragg wavelength of a distributed Bragg reflection mirror configured from a diffraction grating formed at a side face portion of the silicon waveguide core varies by a great amount.

Since equivalent refractive index of the waveguide ($n_{eq}$) proportionally affects the Bragg wavelength ($\lambda_{bragg}$) of the distributed Bragg reflection mirror, it is difficult to stably form a diffraction grating that configures a distributed Bragg reflection mirror having a Bragg wavelength as originally designed in a current process accuracy, and the yield is not high.

Therefore, it is desired to implement, with a high yield, a diffraction grating configuring a distributed Bragg reflection mirror having a Bragg wavelength as originally designed in an optical device, an optical transmission device, an optical reception device, a hybrid laser and an optical transmission apparatus, which include a silicon waveguide core.

In the following, an optical device, an optical transmission device, an optical reception device, a hybrid laser and an optical transmission apparatus according to embodiments are described with reference to the drawings.

First Embodiment

First, an optical device according to a first embodiment is described with reference to FIGS. 1 to 8C.

The optical device according to the present embodiment is a silicon optical device formed on a silicon (Si) substrate. It is to be noted that the optical device is referred to also as optical functional device.

Figure 1:
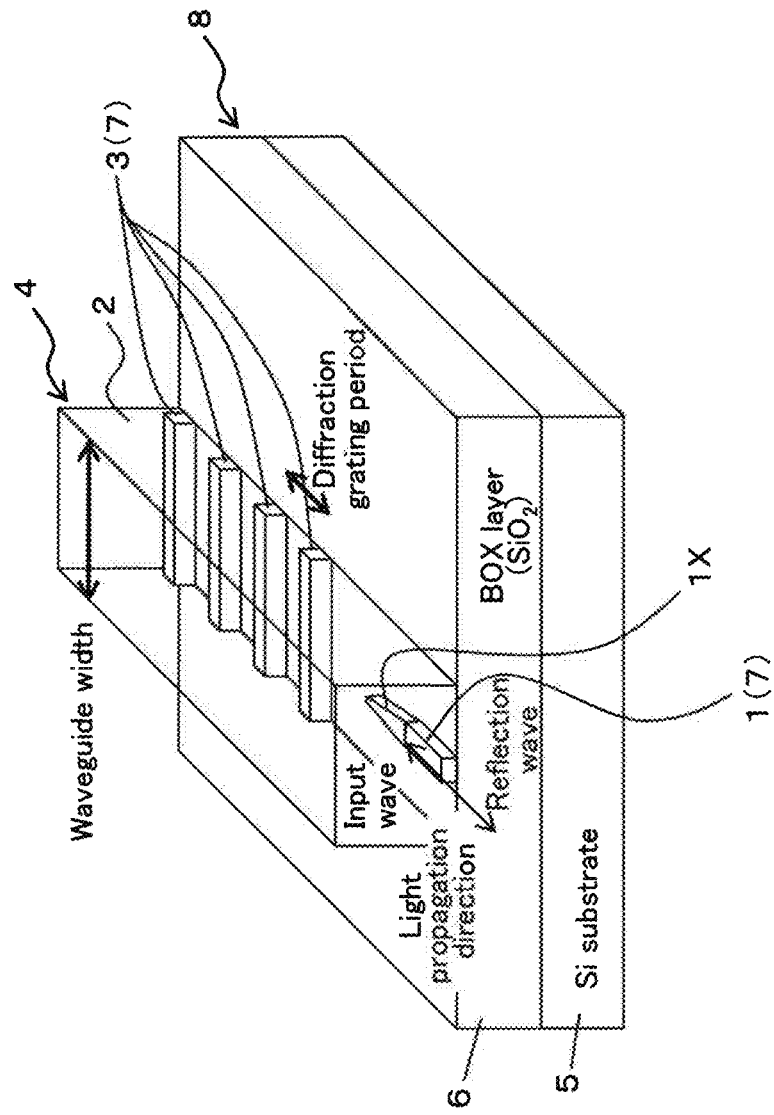
FIG. 1 is a schematic perspective view depicting a configuration of an optical device according to a first embodiment.

As depicted in FIG. 1, the present optical device includes a silicon waveguide core 1, a dielectric waveguide core 2 and a diffraction grating 3 that configures a distributed Bragg reflection mirror (DBR: Distributed Bragg Reflector). Such an optical device 4 as just described is referred to also as reflection type optical filter device. In particular, the dielectric waveguide core 2 formed from a material different from that of the silicon waveguide core 1 is provided at the optical device 4 including the silicon waveguide core 1 such that an optical waveguide is configured from the two waveguide cores 1 and 2 made of materials different from each other. It is to be noted that the silicon waveguide core 1 is referred to also as silicon wire waveguide core or input waveguide core.

In particular, the present optical device 4 is produced using an SOI substrate 8 that includes a BOX layer 6 that is a $SiO_2$ layer having, for example, a thickness of approximately 3 μm and an SOI layer 7 that is a silicon (Si) layer having, for example, a thickness of approximately 250 nm on a Si substrate 5. Here, the silicon waveguide core 1 including a tapered portion 1X and the diffraction grating 3 are formed on the BOX layer 6 from the SOI layer 7 that remains when the SOI layer 7 is etched. Further, the dielectric waveguide core 2 made of, for example, SiON is formed on the BOX layer 6 in such a manner as to cover the silicon waveguide core 1 and the diffraction grating 3 formed from the SOI layer 7 remaining as a result of the etching. It is to be noted that, as a material for the silicon waveguide core 1 configured from a silicon layer, not only monocrystalline silicon but also poly silicon or amorphous silicon may be used. Further, the tapered portion 1X is referred to also as taper structure, taper waveguide or input taper waveguide. Further, the silicon waveguide core 1 is referred to also as SOI layer waveguide core. Further, the diffraction grating 3 is referred to also as SOI surface diffraction grating or SOI layer diffraction grating. Furthermore, the Si substrate is referred to also as Si substrate layer.

Here, the silicon waveguide core 1 includes the tapered portion 1X having a cross section whose size decreases toward a terminal end portion thereof, and configures a single mode waveguide. The silicon waveguide core 1 is terminated at a tip end of the tapered portion 1X thereof. In particular, the silicon waveguide core 1 enclosed in the dielectric waveguide core 2 is terminated intermediately.

Here, a waveguide is configured from the silicon waveguide core 1 and the dielectric waveguide core 2 that covers the silicon waveguide core 1. This waveguide is referred to as silicon waveguide, silicon wire waveguide or input waveguide. It is to be noted that, where a portion of the silicon waveguide core 1 other than the tapered portion 1X is not covered with the dielectric waveguide core 2, a waveguide is configured from the silicon waveguide core 1 and ambient air or a cladding layer (for example, $SiO_2$ cladding layer).

In particular, the width of the portion of the silicon waveguide core 1 other than the tapered portion 1X, namely, the width of the portion at the input end face side, is, for example, approximately 450 nm, and a channel waveguide structure is configured in which the SOI layer 7 at both sides of the silicon waveguide core 1 is removed completely. Especially, the silicon waveguide core 1 is designed so as to be capable of configuring a single mode waveguide in which only a single waveguide mode can exist in each polarization directions of light. In other words, the silicon waveguide core 1 is a single mode waveguide in which a light confinement mechanism by a refractive index boundary is set in the vertical and horizontal directions.

Further, the tapered portion 1X of the silicon waveguide core 1 is a width taper type silicon waveguide core in which, for example, the width of the silicon waveguide core 1 decreases gradually from approximately 450 nm to approximately 50 nm along a light propagation direction. The tapered portion 1X has a taper length (length of a transition region 9 hereinafter described) of approximately 300 μm.

It is to be noted here that, while the tapered portion 1X is configured as a width taper type silicon waveguide core, the configuration thereof is not limited to this, but the tapered portion 1X may be configured as a thickness taper type silicon waveguide core in which the thickness of the silicon waveguide core 1 decreases gradually.

Further, the dielectric waveguide core 2 has a lower refractive index than that of the silicon waveguide core 1 but has a greater cross section size than that of the silicon waveguide core 1, and configures a single mode waveguide. Here, the waveguide is configured from the dielectric waveguide core 2 and a cladding layer having lower refractive index than that of waveguide core (for example, $SiO_2$ cladding layer) or the air covering the dielectric waveguide core 2. This is referred to as dielectric waveguide.

The dielectric waveguide core 2 is provided in such a manner as to cover the entire silicon waveguide core 1 and continue to the silicon waveguide core 1. In particular, the dielectric waveguide core 2 extends from an end portion (end portion at the input side) of the silicon waveguide core 1 at the opposite side to the side at which the tapered portion 1X is provided to a region in which the silicon waveguide core 1 is not provided, namely, to a region in which the diffraction grating 3 is provided. Further, the dielectric waveguide core 2 is terminated at the opposite side to the side at which the silicon waveguide core 1 is provided of the region in which the diffraction grating 3 is provided. The extending direction of the dielectric waveguide core 2, namely, the longitudinal direction of the dielectric waveguide core 2, and the extending direction of the silicon waveguide core 1, namely, the longitudinal direction of the silicon waveguide core 1, coincide with each other. In other words, the light propagation direction of the dielectric waveguide and the light propagation direction of the silicon waveguide coincide with each other. Here, the dielectric waveguide core 2 encloses the silicon waveguide core 1.

In particular, the dielectric waveguide core 2 is provided in such a manner as to extend along the overall length from one end face to the other end face of the optical device 4, and has a channel waveguide structure wherein the width in the horizontal direction is processed to approximately several μm. Especially, the dielectric waveguide core 2 is designed such that a single mode waveguide that allows the presence only of a single waveguide mode in each light polarization direction can be configured. In other words, the dielectric waveguide core 2 is a single mode waveguide in which a light confinement mechanism by a refractive index boundary is set in the vertical and horizontal directions.

Here, as regards the size of the dielectric waveguide core 2, for example, the height and the width are set to approximately 3 μm and approximately, 3 μm, respectively, and the size is great in comparison with that of the silicon waveguide core 1. Further, the dielectric waveguide core 2 is made of, for example, SiON, and the refractive index of the dielectric waveguide core 2 is, for example, approximately 1.50 and is low in comparison with the refractive index (approximately 3.44) of the silicon waveguide core 1, but high in comparison with the refractive index of cladding layer and BOX layer. It is to be noted that, while the refractive index of the dielectric waveguide core 2 is not limited to this and can assume various values by composition adjustment of the material, it is preferable to set the refractive index to a range, for example, from approximately 1.44 or more to approximately 2.30 or less.

It is to be noted here that, while the dielectric waveguide core 2 is provided so as to cover the entire silicon waveguide core 1 including the tapered portion 1X, the configuration thereof is not limited to this, but the dielectric waveguide core 2 may be provided so as to cover at least the tapered portion 1X.

Further, the diffraction grating 3 is provided at the single mode waveguide configured from the dielectric waveguide core 2. The diffraction grating 3 is provided in a region, in which the silicon waveguide core 1 does not exist, of the dielectric waveguide core 2 that encloses the silicon waveguide core 1. In other words, the diffraction grating 3 is provided in the optical waveguide region in which the silicon waveguide core 1 does not exist but only the dielectric waveguide core 2 exists.

Here, the diffraction grating 3 is configured from a narrow-line shaped silicon film having a refractive index different from that of the dielectric waveguide core 2 and provided periodically. Further, the diffraction grating 3 here is provided on the same plane as the silicon waveguide core 1 and is enclosed in the dielectric waveguide core 2. Further, the width of the diffraction grating 3 here, namely, the length in an orthogonal direction to the light propagation direction, is equal to that of the dielectric waveguide core 2. It is to be noted that the silicon film is referred to also as silicon layer.

In particular, the diffraction grating 3 is structured such that a region in which the SOI layer (Si layer) 7 is removed and another region in which the SOI layer 7 remains are repetitively formed in a predetermined period (for example, approximately 520 nm) along the light propagation direction. Since the height of the diffraction grating 3 here is equal to the thickness of the SOI layer 7, it is approximately 250 nm. Further, the width of the diffraction grating 3 is equal to that of the dielectric waveguide core 2 and therefore is approximately 3 μm. Further, the lengths of the portion at which the SOI layer 7 is removed and the portion at which the SOI layer 7 remains are approximately 260 nm, and the duty ratio of the diffraction grating 3 is approximately 50%. Further, the length of the region in which the diffraction grating 3 is provided (length of a distributed Bragg reflection mirror region 11 hereinafter described) is approximately 500 μm. It is to be noted that, as a material of the diffraction grating 3 configured from a silicon film, not only monocrystalline silicon but also poly silicon or amorphous silicon may be used. However, it is preferable to form the diffraction grating 3 from an SOI layer similarly to the silicon waveguide core 1 in that a precise diffraction grating can be formed by a high processing technology for an SOI waveguide formed from an SOI layer.

It is to be noted that a cladding layer made of a material having a refractive index lower than that of the dielectric waveguide core 2 (for example, $SiO_2$; refractive index of approximately 1.44) may be provided so as to cover the upper face and a side face of the dielectric waveguide core 2. In other words, at the outer side of the optical waveguide configured from the silicon waveguide core 1 and the dielectric waveguide core 2, a cladding layer made of a material having a lower refractive index than those of the cores 1 and 2 may be provided. However, the periphery of the cores may be covered with air without providing the cladding layer.

Figure 2:
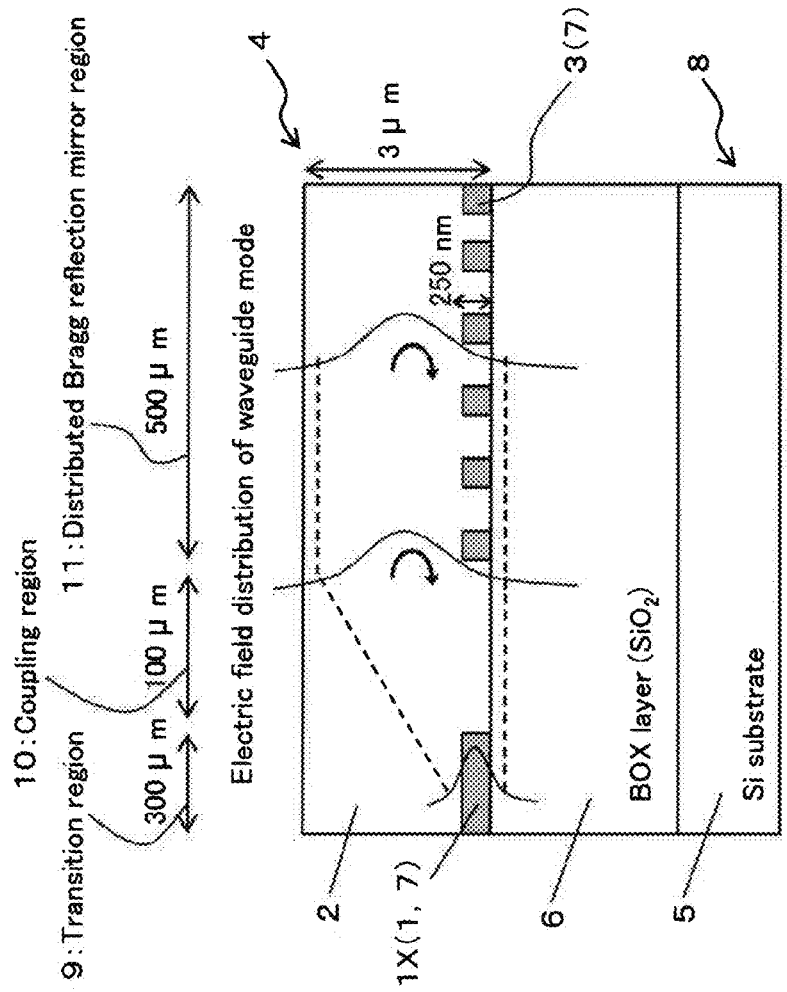
FIG. 2 is a schematic view depicting the configuration of the optical device according to the first embodiment and is a sectional view taken along a direction in which an optical waveguide extends.

As depicted in FIG. 2, the present optical device 4 configured in such a manner as described above includes the transition region 9 including the tapered portion 1X of the silicon waveguide core 1, the distributed Bragg reflection mirror region 11 including the diffraction grating 3, and a coupling region 10 that couples the transition region 9 and the distributed Bragg reflection mirror region 11 to each other. Here, the coupling region 10 is a region for stabilizing a mode. It is to be noted that the transition region 9 is a region including the tapered portion 1X of the silicon waveguide core 1. In other words, in the transition region 9, the silicon waveguide core 1 has a taper shape. The transition region 9 is a region to a terminal end portion of the silicon waveguide core 1, namely, to a tip end portion of the tapered portion 1X.

In such a present optical device 4 as described above, light is inputted to the silicon waveguide configured from the silicon waveguide core 1. It is to be noted that this light is referred to also as signal light, input light or input wave.

Then, the light propagated in the silicon waveguide transits in a high efficiency from the silicon waveguide to the dielectric waveguide configured from the dielectric waveguide core 2 in the transition region 9 in which the silicon waveguide core 1 is formed in a taper shape, and at the terminal end of the transition region 9, substantially entire optical power transfers to a waveguide mode (fundamental mode) of the dielectric waveguide. This phenomenon appears in accordance with a principle similar to that of the spot size converter reported, for example, in Tai Tsuchizawa et al., "Microphonics Devices Based on Silicon Microfabrication Technology", IEEE JOURNAL OF SELECTED TOPICS IN QUANTUM ELECTRONICS, Vol. 11, No. 1, January/February 2005, the entire content of which is incorporated herein by reference.

FIGS. 3A to 3C are views illustrating a variation of the optical waveguide mode distribution in the transition region 9 of the optical device 4 having the particular structure described above, and FIGS. 3B and 3C depict results of calculation of the optical waveguide mode distributions at the input side and the output side, respectively.

It is to be noted here that an optical waveguide mode distribution after signal light of a fundamental waveguide mode is inputted to the silicon waveguide and passes the transition region 9 has been calculated using a beam propagation method. The optical waveguide mode distribution is referred to also as optical mode distribution. Further, while the calculation here is performed based on a configuration in which a cladding layer 12 ($SiO_2$) is provided so as to cover the tapered portion 1X of the silicon waveguide core 1 and the dielectric waveguide core 2 in the transition region 9 as depicted in FIG. 3A, a similar result can be obtained even if the calculation is performed based on another configuration in which the cladding layer 12 is not provided. Further, while the optical device 4 is formed based on a configuration in which the entire tapered portion 1X of the silicon waveguide core 1 provided in the transition region 9 is not covered with the dielectric waveguide core 2, a similar result can be obtained even if the entire tapered portion 1X is covered with the dielectric waveguide core 2. It is to be noted that part of the tapered portion 1X of the silicon waveguide core 1 of the transition region 9 may be covered with the dielectric waveguide core 2 in this manner or the entire tapered portion 1X may be covered.

As depicted in FIG. 3B, the signal light is confined strongly in a very small cross section of the silicon waveguide core 1 at the input side. On the other hand, as depicted in FIG. 3C, output light passing the transition region 9 is spread in an optical electric field distribution thereof to a magnitude of approximately several μm, and this coincides with that of the fundamental waveguide mode of the dielectric waveguide (SiON waveguide) configured from the dielectric waveguide core (SiON waveguide core) 2.

The light transited to the dielectric waveguide in the transition region 9 and transferred to the waveguide mode of the dielectric waveguide in such a manner as described above propagates in the dielectric waveguide as depicted in FIG. 2. Here, the mode shape is stabilized first in the coupling region 10 and then the light undergoes light diffraction by the diffraction grating 3 configuring the distributed Bragg reflection mirror provided at the dielectric waveguide. Then, only light of a predetermined wavelength corresponding to a reflection band wavelength of the distributed Bragg reflection mirror, namely, only a light component of a wavelength corresponding to the Bragg wavelength, is selectively reflected.

Figure 4B:
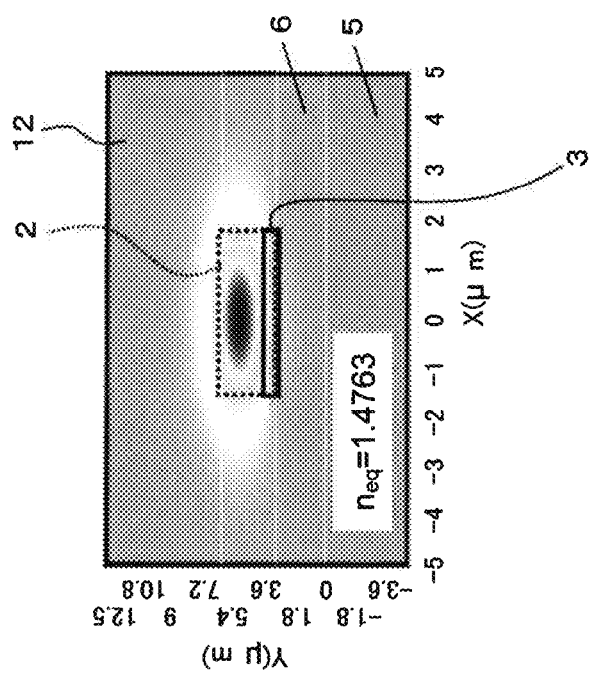
FIG. 4B is a view depicting an optical electric field distribution in a region that includes a diffraction grating of the dielectric waveguide.
Figure 4A:
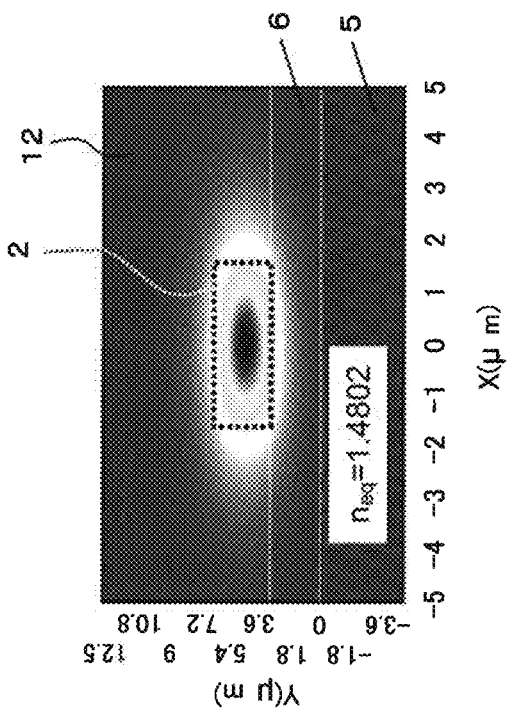
FIG. 4A is a view depicting an optical electric field distribution in a region in which there exists no diffraction grating of the dielectric waveguide including a SiON waveguide core (refractive index n=1.50) as a dielectric waveguide core in a distributed Bragg reflection mirror region configuring the optical device according to the first embodiment.

Here, FIGS. 4A and 4B depict results when the optical waveguide mode distribution in the distributed Bragg reflection mirror region 11 of the present optical device 4 having the particular structure described above is calculated. It is to be noted that the optical waveguide mode distribution is referred to also as optical electric field distribution.

It is to be noted that FIG. 4A depicts an optical waveguide mode distribution in a region in which the diffraction grating 3 does not exist, and FIG. 4B depicts an optical waveguide mode distribution in a region in which the diffraction grating 3 exists. Here, the cladding layer 12 ($SiO_2$ layer) having a sufficient thickness is provided around the SiON waveguide core (approximately 3 μm high and approximately 3 μm wide) as the dielectric waveguide core 2 and the diffraction grating 3 (Si layer; approximately 250 nm high and approximately 3 μm wide).

As depicted in FIGS. 4A and 4B, it is recognized that the optical waveguide mode is deformed by the presence of the diffraction grating 3 and the equivalent refractive index of the waveguide is modulated. In particular, it is recognized that, while the equivalent refractive index $n_{eq}$ in the region in which the diffraction grating 3 does not exist is 1.4802 as depicted in FIG. 4A, the equivalent refractive index $n_{eq}$ in the region in which the diffraction grating 3 exists is 1.4763 as depicted in FIG. 4B. Further, the optical waveguide mode is deformed by the presence or absence of the diffraction grating 3 and the equivalent refractive index of the waveguide is modulated. By this effect, the signal light senses the refractive index modulation of a diffraction grating period in the distributed Bragg reflection mirror region 11 and reflection diffraction occurs in a specific wavelength corresponding to the Bragg wavelength.

Then, the light reflected by the distributed Bragg reflection mirror in such a manner as described above propagates in the reverse direction in the dielectric waveguide as depicted in FIG. 2, and transits to the silicon waveguide in the transition region 9 and propagates in the reverse direction in the silicon waveguide, whereafter it is extracted as reflection light from an end face of the silicon waveguide. It is to be noted that the reflection light is referred to also as reflection wave.

On the other hand, light of a wavelength component that is not reflected by the distributed Bragg reflection mirror advances straightforwardly in the dielectric waveguide and is irradiated to the outer side at a terminal end (device end portion) of the dielectric waveguide. Therefore, there is no case that the light is mixed back into the silicon waveguide.

Figure 5:
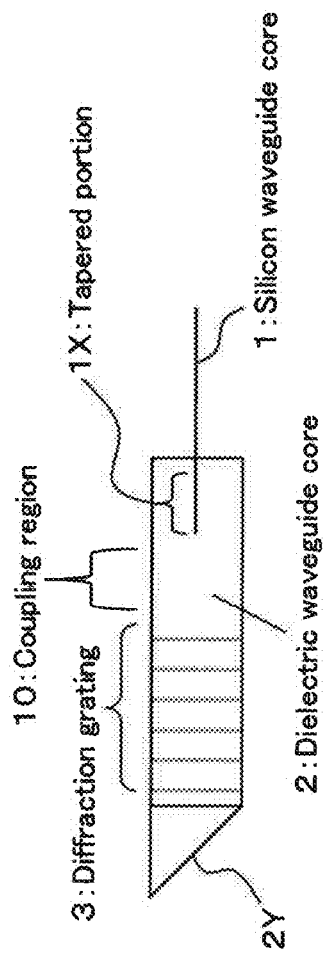
FIG. 5 is a schematic top plan view depicting a configuration of a modification to a terminal end face of the dielectric waveguide core configuring the optical device according to the first embodiment.

It is to be noted that a taper structure wherein the size of the sectional area of the waveguide varies gradually may be provided (for example, refer to FIG. 14) in order to avoid unnecessary end face reflection at the terminal end of the dielectric waveguide core 2. In particular, the dielectric waveguide core 2 may be configured so as to include a tapered portion 2X, which has a cross section that increases toward a terminal end portion, at the opposite side to the silicon waveguide core 1 across the diffraction grating 3. Further, as depicted in FIG. 5, an oblique end face structure wherein a normal line of the terminal end face is inclined with respect to the light propagation direction may be adopted at the terminal end of the dielectric waveguide core 2. In particular, the dielectric waveguide core 2 may be configured such that the end face at the opposite side thereof to the silicon waveguide core 1 across the diffraction grating 3 is configured as an oblique end face 2Y inclined with respect to the light propagation direction.

In this manner, in the present embodiment, the diffraction grating 3 is provided at the dielectric waveguide having a low size dependency in place of a configuration wherein the diffraction grating is provided at the silicon waveguide core 1 having a high size dependency with which, if the size is displaced even a little, then the equivalent refractive index and hence the Bragg wavelength vary by a great amount. In other words, a structure is applied that the dielectric waveguide is provided at the optical device 4 including the silicon waveguide independently of the silicon waveguide and the diffraction grating 3 is provided at the dielectric waveguide such that the silicon waveguide and the dielectric waveguide are coupled to each other with a high efficiency. In this case, the dielectric waveguide core 2 is small in refractive index difference from the cladding and great in cross section size in comparison with those of the silicon waveguide core 1. Therefore, even if the size is displaced even a little upon fabrication, the variation of the equivalent refractive index of the waveguide and hence of the Bragg wavelength is small. Consequently, in the optical device 4 including the silicon waveguide core 1, the diffraction grating 3 configuring the distributed Bragg reflection mirror that has a Bragg wavelength as originally designed can be produced with a high yield.

Figure 6B:
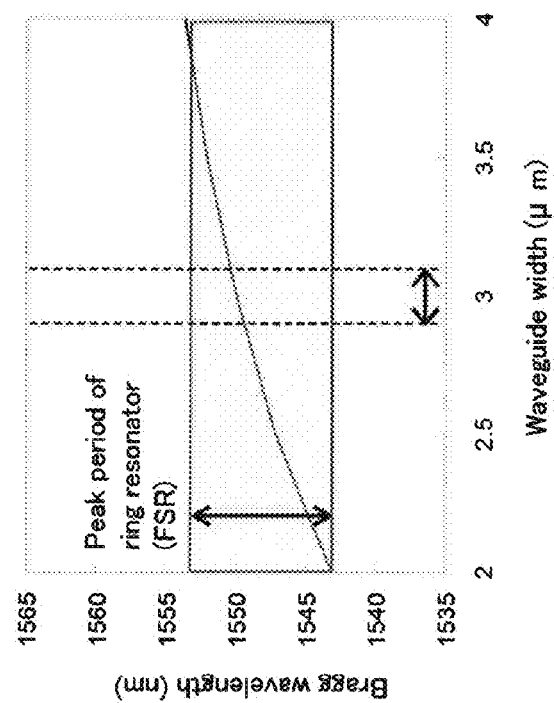
FIG. 6B is a view depicting a waveguide width dependency of a Bragg wavelength in the distributed Bragg reflection mirror region.
Figure 6A:
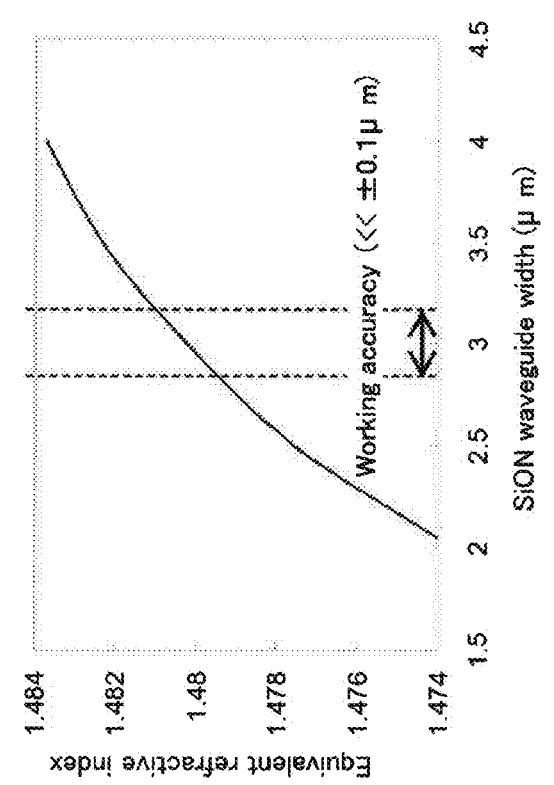
FIG. 6A is a view depicting a waveguide width dependency of an equivalent refractive index of the waveguide in the distributed Bragg reflection mirror region configuring the optical device according to the first embodiment.

Here, FIG. 6A depicts a waveguide width dependency of the equivalent refractive index of the distributed Bragg reflection mirror region 11 of the optical device 4 having the particular structure described above. It is to be noted here that the waveguide width signifies the width of the SiON waveguide core as the dielectric waveguide core 2.

As depicted in FIG. 6A, the dielectric waveguide core 2 has a small refractive index difference (refractive index contrast) from the cladding and a great cross section size in comparison with those of the silicon waveguide core 1. Therefore, the variation of the equivalent refractive index is on the 0.1% order and is very small with respect to the waveguide width variation of ±0.1 μm that is standard processing accuracy of waveguide formation.

Further, FIG. 6B depicts a waveguide width dependency of the Bragg wavelength of the distributed Bragg reflection mirror estimated from a result of calculation of the equivalent refractive index.

As depicted in FIG. 6B, the variation amount of the Bragg wavelength is approximately 2 nm and is sufficiently small with respect to the waveguide width variation of ±0.1 μm within a range of the processing accuracy. This is sufficiently small in comparison with an free spectral range (FSR) (>10 nm) that is a peak period of the ring resonator where the present optical device 4 is used as a wavelength selection reflection mirror such as a hybrid laser as hereinafter described. It should be noted that the variation amount of the Bragg wavelength is small enough also for the height error on the dielectric waveguide, in a same manner.

In this manner, in the present optical device 4, the variation amount of the Bragg wavelength arising from a dimensional variation upon production is very small in comparison with that where the diffraction grating is formed on the silicon waveguide core. Thus, the diffraction grating 3 configuring the distributed Bragg reflection mirror that has a Bragg wavelength as originally designed can be produced in stability with the processing accuracy at present. Especially, where the present optical device 4 is used as a wavelength selection reflection mirror such as a hybrid laser as hereinafter described, a stabilized oscillation wavelength and characteristic can be obtained without being influenced by the dimensional variation upon device fabrication.

Figure 7:
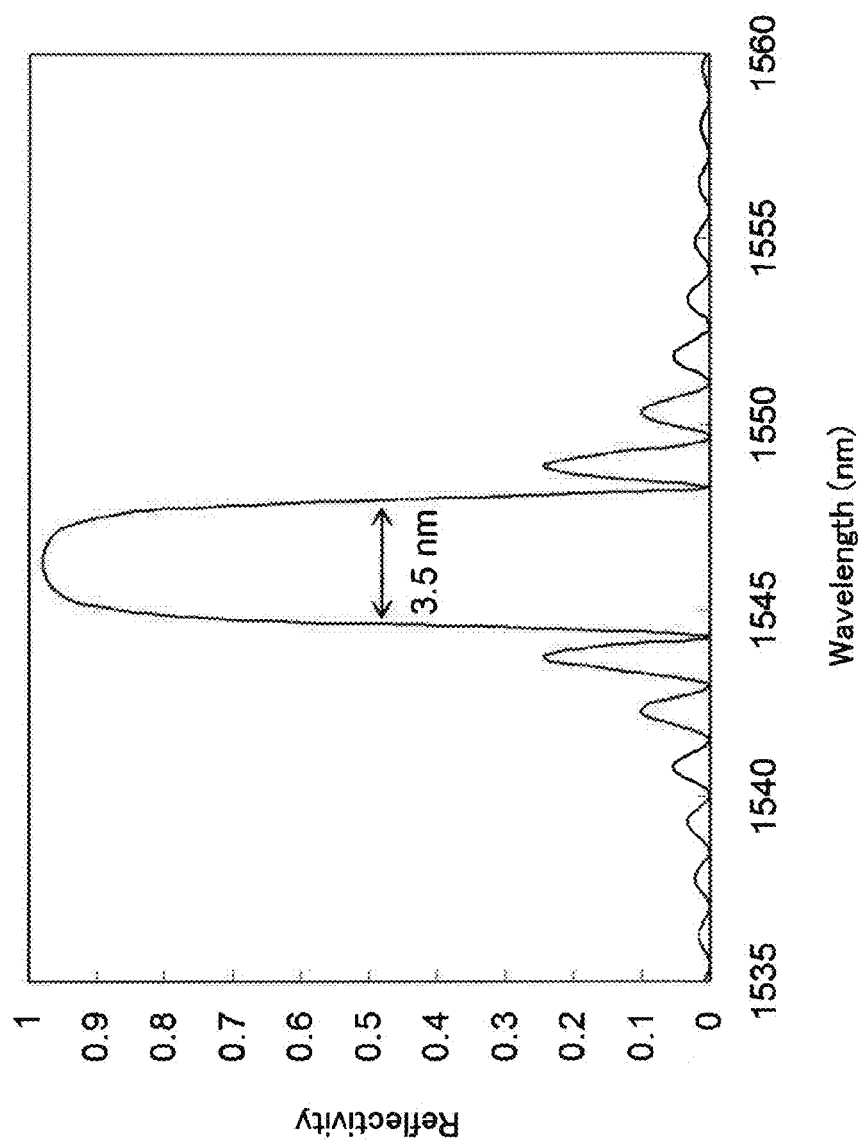
FIG. 7 is a view depicting a reflection spectrum characteristic of the distributed Bragg reflection mirror region configuring the optical device according to the first embodiment.

FIG. 7 depicts a reflection spectrum characteristic of the distributed Bragg reflection mirror of the present optical device 4 having the particular structure described above.

In the particular structure described above, the distributed Bragg reflection mirror that includes the diffraction grating 3 having a period of approximately 520 nm and a coupling coefficient of approximately 78 cm$^{-1}$ and has a length of approximately 500 μm is used. In this case, as depicted in FIG. 7, it is recognized that a reflection wavelength band width of approximately 3.5 nm and a high reflectance of approximately 90% or more are obtained. This is a sufficient characteristic also where the present optical device 4 is used as the wavelength selection reflection mirror such as a hybrid laser as hereinafter described.

Now, a fabrication method for the present optical device is described with reference to FIGS. 8A to 8C.

First, an SiO$_2$ hardmask layer not depicted is formed on the SOI substrate 8, and a pattern of the silicon waveguide core 1 including the tapered portion 1X and the diffraction grating 3 is formed on the hard mask layer, for example, by photolithography or electron beam exposure.

Figure 8A:
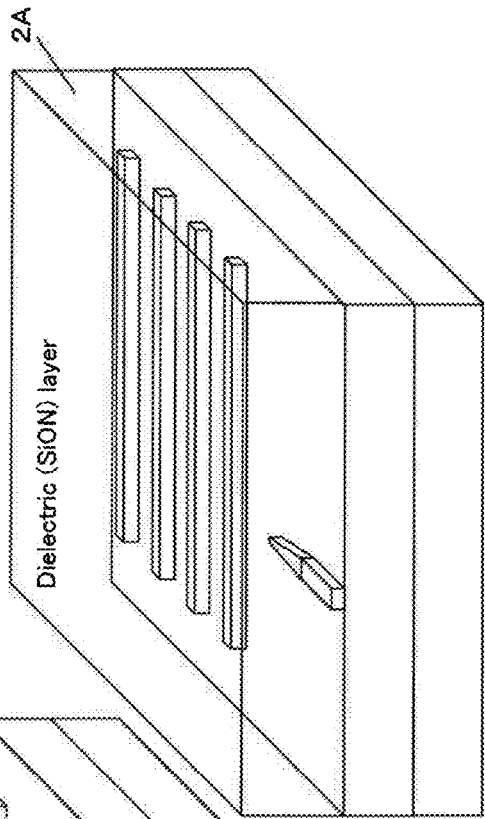
FIGS. 8A to 8C are schematic perspective views illustrating a fabrication method of the optical device according to the first embodiment.

Then, the SOI layer 7 is etched as depicted in FIG. 8A using the hard mask layer having such a pattern as just described such that the silicon waveguide core 1 including the tapered portion 1X and the diffraction grating 3 are formed from the remaining SOI layer 7.

Figure 8B:
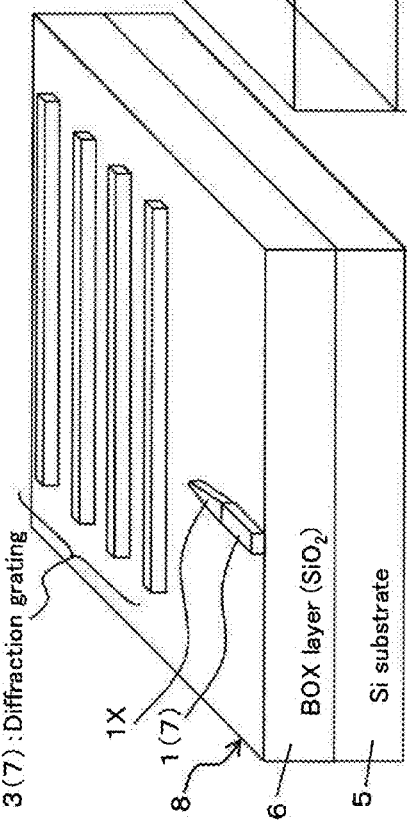

Then, as depicted in FIG. 8B, a dielectric layer 2A made of, for example, SiON and having a thickness of approximately 3 μm is formed on the overall area, for example, by a plasma CVD method.

Figure 8C:
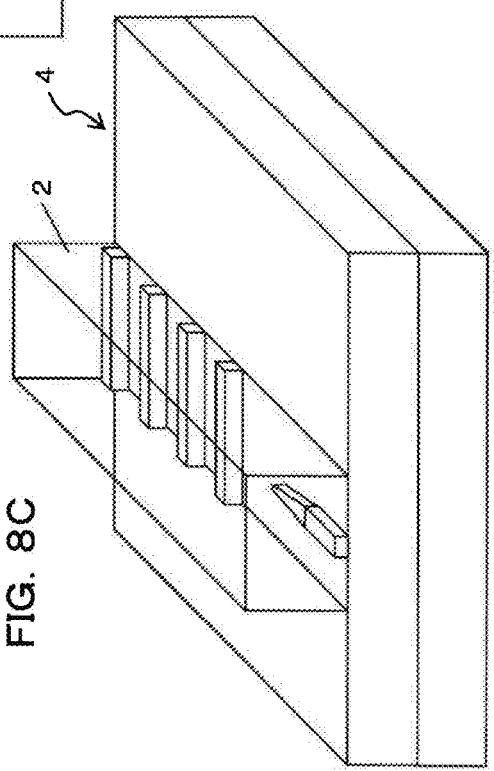

Then, for example, patterning is performed using a resist mask and dry etching is performed to remove an unnecessary portion of the dielectric layer 2A as depicted in FIG. 8C to form the dielectric waveguide core 2. In other words, the dielectric waveguide core 2 is formed on the BOX layer 6 so as to cover the silicon waveguide core 1 including the tapered portion 1X and the diffraction grating 3 formed from the remaining SOI layer 7.

Then, an SiO$_2$ cladding layer having a thickness of, for example, approximately 5 μm is deposited on the overall device as occasion demands thereby to complete the present optical device 4.

Accordingly, the optical device according to the present embodiment is advantageous in that, in the configuration of the optical device including the silicon waveguide core 1, the diffraction grating 3 configuring the distributed Bragg reflection mirror that has a Bragg wavelength as originally designed can be implemented with a high yield.

It is to be noted that the present invention is not limited to the configuration specifically described above in connection with the embodiment, and variations and modifications can be made without departing from the scope of the present invention.

For example, while the diffraction grating 3 in the embodiment described above is configured such that it is provided on the same plane as the silicon waveguide core 1 and the silicon film having an equal width to that of the dielectric waveguide core 2 is provided periodically, the present invention is not limited to this.

For example, a material having a refractive index different from that of the dielectric waveguide core 2 may be used as the material configuring the diffraction grating 3, and not only silicon but also various materials such as poly silicon, a dielectric, a metal or a polymer can be used. In particular, the diffraction grating 3 can be also configured not only from a silicon film but also from a poly silicon film, a dielectric film, a metal film, a polymer film or the like. In this manner, as the material configuring the diffraction grating 3, a material same as that configuring the silicon waveguide core 1, namely, a material having a refractive index equal to that of a material configuring the silicon waveguide core 1, may be used or a material different from that configuring the silicon waveguide core 1, namely, a material having a refractive index different from that of a material configuring the silicon waveguide core 1, may be used.

Figure 9:
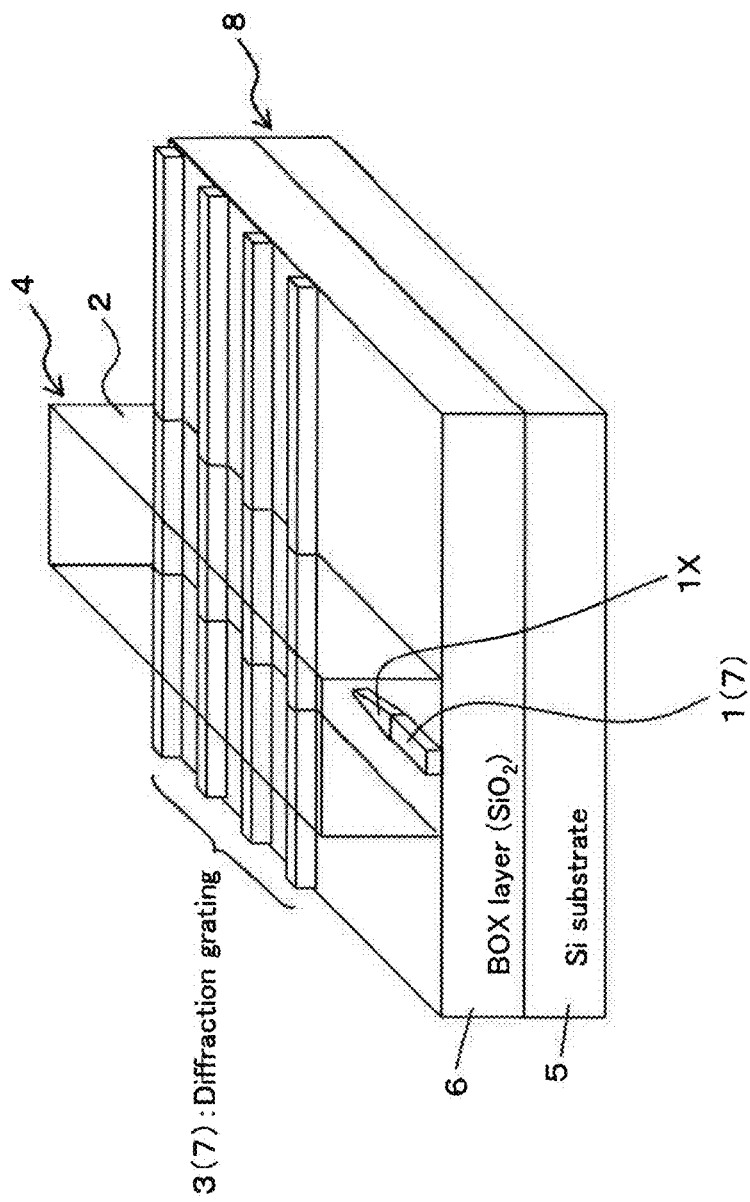
FIG. 9 is a schematic perspective view depicting a configuration of an optical device according to a modification to the first embodiment.

Further, for example, as the shape of the diffraction grating 3, a shape having a width equal to that of the dielectric waveguide core 2 may not be applied, and the diffraction grating 3, namely, a film configuring the diffraction grating 3, may project to the outer side of the dielectric waveguide core 2 as depicted in FIG. 9. By using this structure depicted in FIG. 9, the Bragg wavelength of the diffraction grating 3 can be further stabilized for the fabrication error on the waveguide core 1.

Further, the diffraction grating 3, namely, the film configuring the diffraction grating 3, may be provided at the upper face of the dielectric waveguide core 2.

Figure 10:
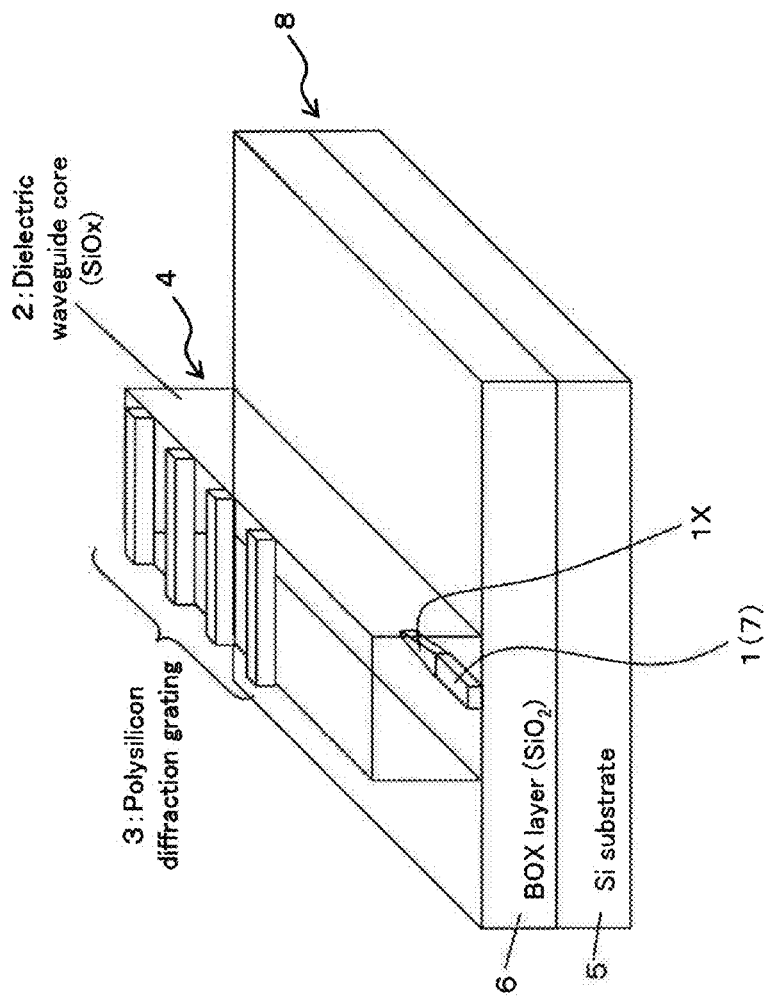
FIG. 10 is a schematic perspective view depicting a configuration of an optical device according to another modification to the first embodiment.

For example, as depicted in FIG. 10, the dielectric waveguide core 2 may be configured so as to have a channel waveguide structure configured from SiO$_x$ (approximately 1.55 in refractive index, approximately 2 μm thick, approximately 2 μm wide), and the diffraction grating 3 configured from a poly silicon layer (approximately 300 nm thick) may be provided at the upper face of the dielectric waveguide core 2. Such a structure as just described can be produced by forming a pattern of the silicon waveguide core 1 including the tapered portion 1X on the SOI substrate 8 and forming an SiO$_x$ layer and a poly silicon layer in order on the overall area and then etching the poly silicon layer to a diffraction grating pattern and etching the SiO$_x$ layer to form the dielectric waveguide core 2. In this structure, by suitably adjusting the size of the SiO$_x$ layer or the thickness of the poly silicon layer, a higher degree of freedom in design than that of the embodiment described above is obtained relating to the coupling coefficient of the diffraction grating 3 configuring the distributed Bragg reflection mirror, and a high reflectance can be obtained with a shorter working length. It is to be noted that, while, in the present modification, SiO$_x$ is used as the material of the dielectric waveguide core 2 and poly silicon is used as the material of the diffraction grating 3, the materials are not limited to them and the materials in the embodiment and the modifications thereto described above can be used.

Further, the diffraction grating 3 may be configured by periodically varying the cross section size of the dielectric waveguide core 2.

Figure 11:
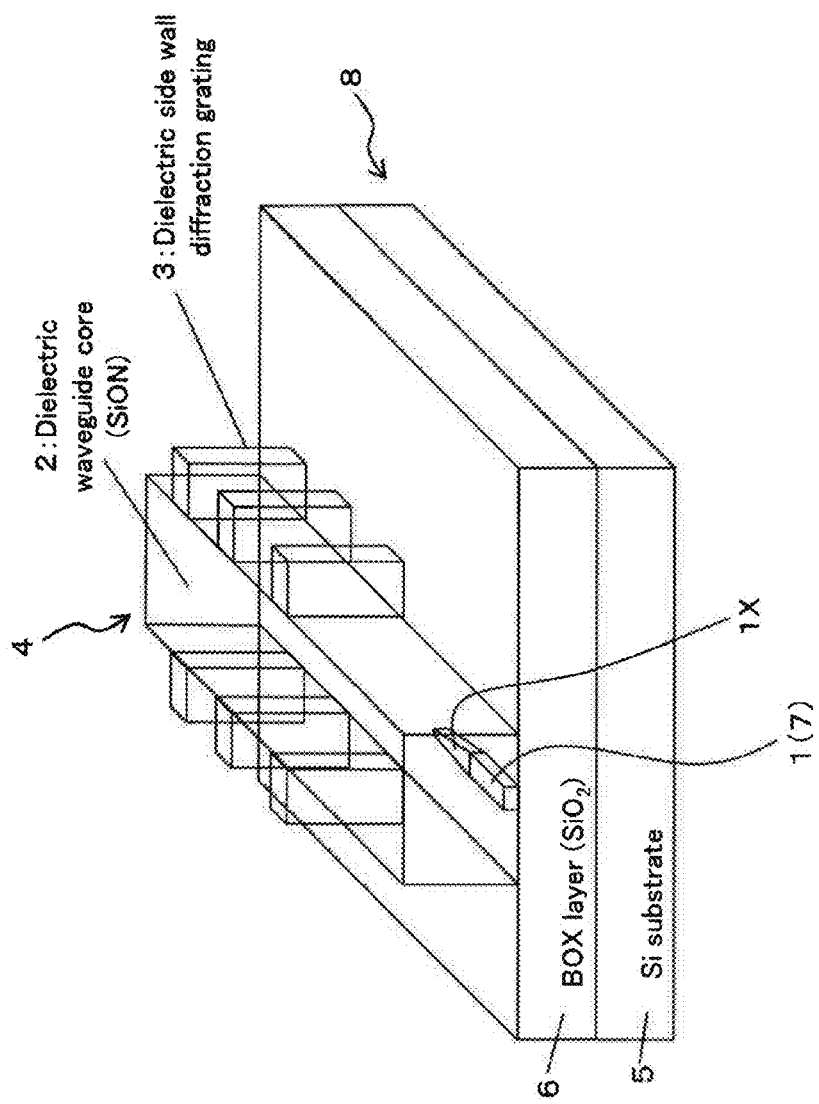
FIG. 11 is a schematic perspective view depicting a configuration of an optical device according to a further modification to the first embodiment.

For example, the diffraction grating 3 may be configured from those portions of the dielectric waveguide core 2 which project from the side face as depicted in FIG. 11. In particular, the diffraction grating 3 may be configured as a side wall diffraction grating (dielectric side wall diffraction grating) configured by periodically modulating the waveguide width of the dielectric waveguide core 2. In this case, in order to form the diffraction grating 3 configuring the distributed Bragg reflection mirror, a film made of a different material need not be formed, and the diffraction grating 3 can be easily formed only if a mask pattern for forming the dielectric waveguide core 2 is changed.

Figure 12:
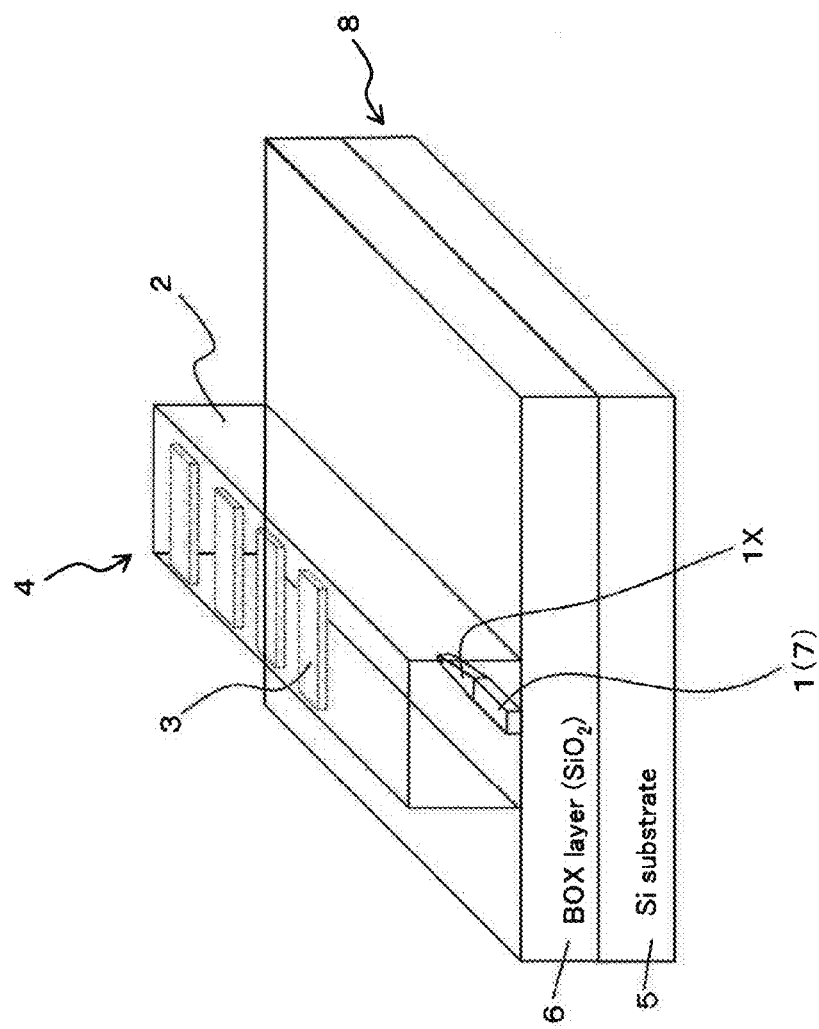
FIG. 12 is a schematic perspective view depicting a configuration of an optical device according to a still further modification to the first embodiment.

Further, the diffraction grating 3 may be configured, for example, from a concave portion of the upper face of the dielectric waveguide core 2 as depicted in FIG. 12.

Further, the diffraction grating 3 may be configured by chirping the period or the structure thereof. This makes it possible to vary the reflection spectrum characteristic of the distributed Bragg reflection mirror. In this manner, the distributed Bragg reflection mirror may be configured as a chirped distributed Bragg reflection mirror whose period or coupling coefficient varies along the light propagation direction. It is to be noted that "period" of the diffraction grating 3 signifies not only a fixed period but also a varying period.

Figure 13:
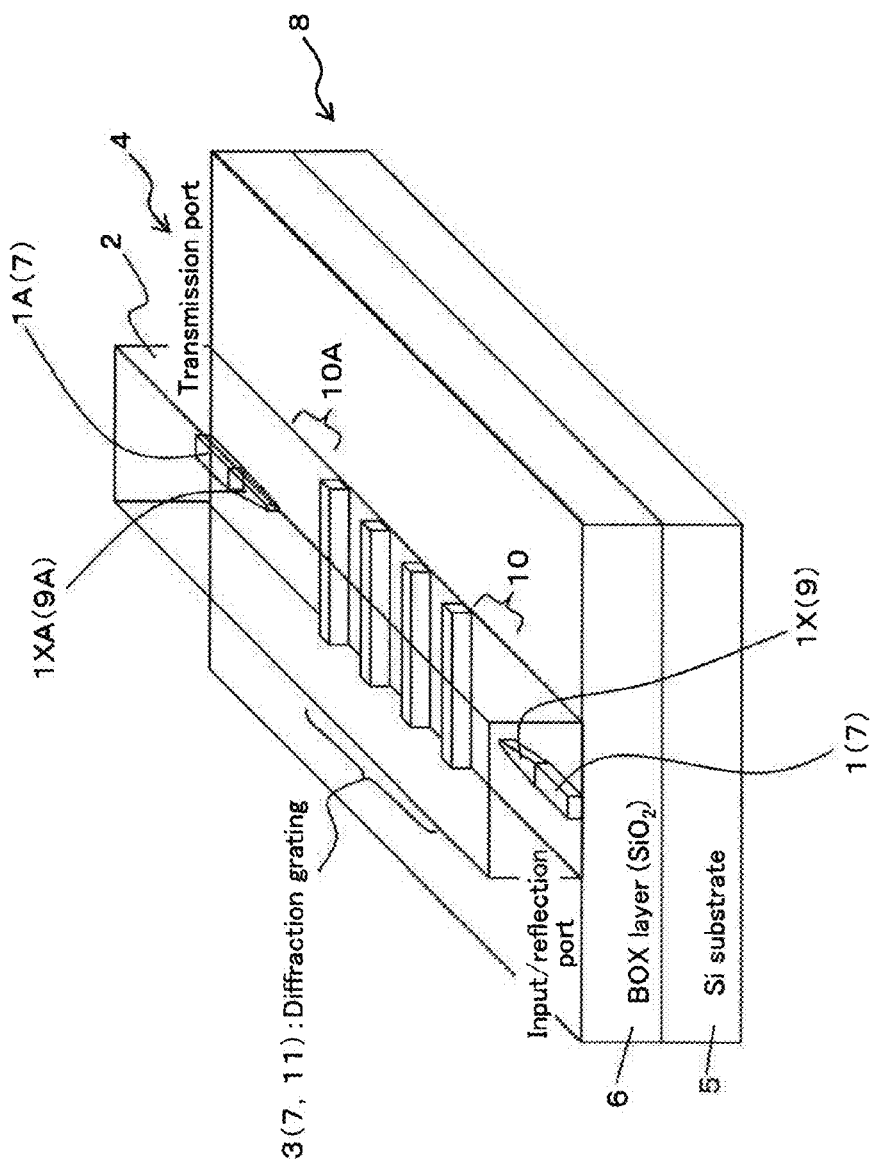
FIG. 13 is a schematic perspective view depicting a configuration of an optical device according to a yet further modification to the first embodiment.

Further, while the silicon waveguide core 1 including the tapered portion 1X in the present embodiment described hereinabove is provided only at one side of the diffraction grating 3 configuring the distributed Bragg reflection mirror along the light propagation direction, the present invention is not limited to this. For example, the silicon waveguide core 1 including the tapered portion 1X and a different silicon waveguide core 1A including a tapered portion 1XA may be provided such that a symmetric structure with respect to the diffraction grating 3 configuring the distributed Bragg reflection mirror is configured at both sides of the diffraction grating 3 configuring the distributed Bragg reflection mirror along the light propagation direction as depicted in FIG. 13. In this case, the configuration described above may be modified such that the different silicon waveguide core 1A including the tapered portion 1XA whose cross section size decreases toward a terminal end portion thereof is provided at the opposite side to the silicon waveguide core 1 across the diffraction grating 3 such that the terminal end portion of the different silicon waveguide core 1A comes to the diffraction grating 3 side and the dielectric waveguide core 2 covers at least the tapered portion 1XA of the different silicon waveguide core 1A. Also in this case, a coupling region 10A may be provided between a transition region 9A in which the tapered portion 1XA of the different silicon waveguide core 1A is provided and the distributed Bragg reflection mirror region 11 in which the diffraction grating 3 is provided. In this structure, one end face of the silicon waveguide core 1 configures an incident/reflection port and the other end face of the silicon waveguide core 1 configures a transmission port. Further, in this structure, by suitably designing the working length and the coupling coefficient of the diffraction grating 3 configuring the distributed Bragg reflection mirror, the peak reflectance of the distributed Bragg reflection mirror can be suppressed lower than that upon total reflection. Consequently, a function as a half mirror for reflecting part of a wavelength component corresponding to the Bragg wavelength from within the inputted signal light but passing the remaining part of the wavelength component therethrough can be implemented.

Second Embodiment

Now, an optical device and a hybrid laser according to a second embodiment are described with reference to FIGS. 14 to 17C.

Figure 14:
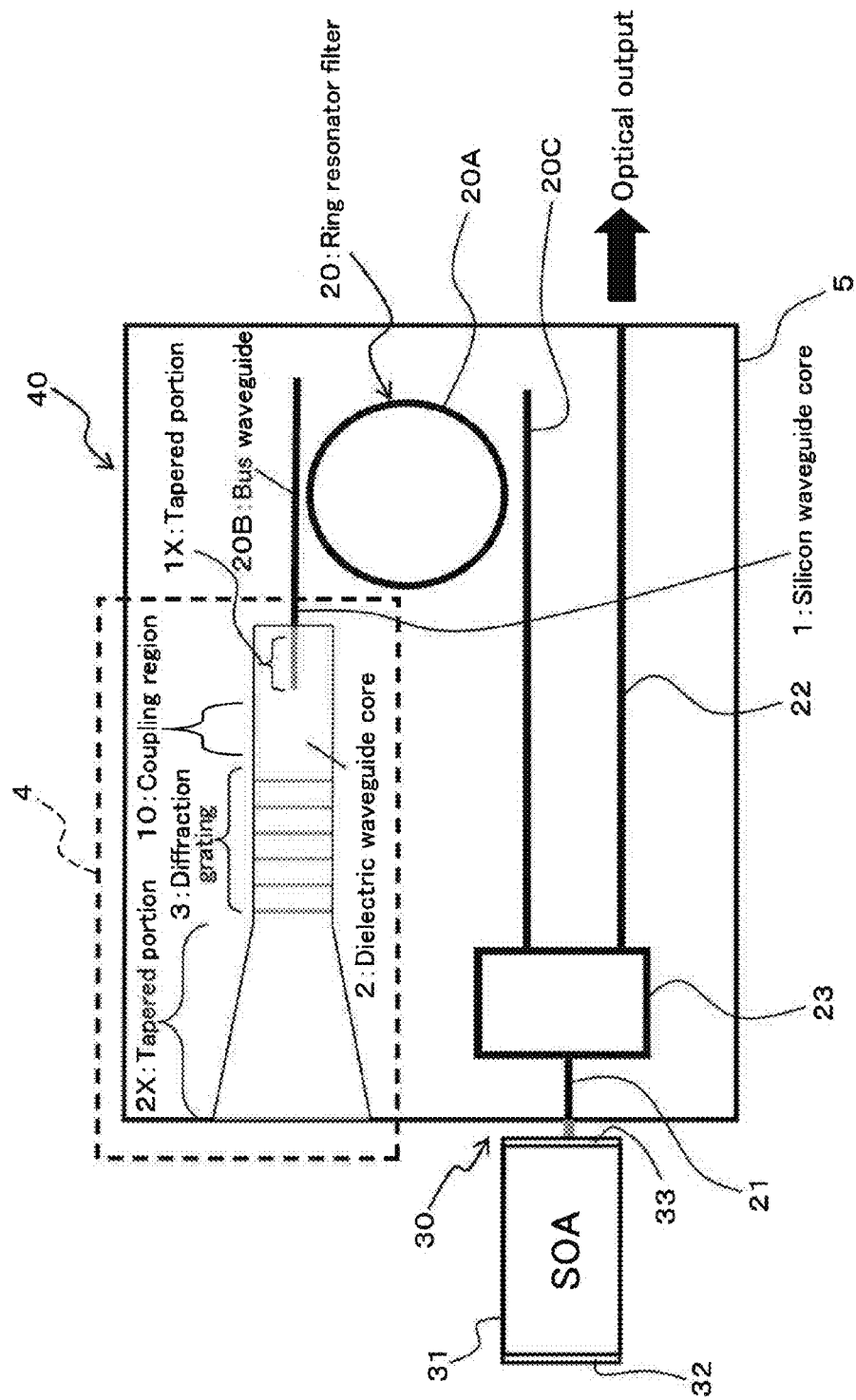
FIG. 14 is a schematic top plan view depicting a configuration of an optical device and a hybrid laser according to a second embodiment.

As depicted in FIG. 14, the optical device according to the present embodiment includes a ring resonator filter 20, an input waveguide 21, an output waveguide 22 and an optical coupler 23 in addition to the components included in the optical device 4 of the first embodiment and the modifications thereto (for example, refer to FIGS. 1, 5, 9 to 12) described hereinabove. In particular, the present optical device 40 is an optical integrated device in which the optical device 4 of any of the first embodiment and the modifications thereto described above, namely, the reflection type optical filter device, ring resonator filter 20, input waveguide 21, output waveguide 22 and optical coupler 23, are integrated on the silicon substrate 5.

In the optical device 40, the optical device 4 of any of the first embodiment and the modifications thereto described above, namely, the reflection type optical filter device, is used to select one of periodical transmission peak wavelengths of the ring resonator filter 20 that configures a hybrid laser 30 hereinafter described. Therefore, the optical device 4 of any of the first embodiment and the modifications thereto described above is referred to also as wavelength selection reflection mirror. Further, a set of the wavelength selection reflection mirror 4 and the ring resonator filter 20 is referred to also as wavelength selection mechanism or wavelength filter. Further, the present optical device 40 is referred to also as optical functional device, optical communication device, optical transmission device, silicon device or silicon filter device.

Here, the ring resonator filter 20 includes a ring waveguide 20A and two bus waveguides 20B and 20C provided at both sides across the ring waveguide 20A. The bus waveguide 20B is coupled to a silicon waveguide configured from the silicon waveguide core 1 of any of the optical devices 4 in the first embodiment and the modifications thereto described above, and the other bus waveguide 20C is coupled to the optical coupler 23. In other words, the wavelength selection reflection mirror 4 in any of the first embodiment and the modifications thereto described above is coupled to one side of the ring resonator filter 20, and the optical coupler 23 is coupled to the other side of the ring resonator filter 20. It is to be noted that the ring resonator filter 20 is referred to simply also as ring resonator.

Further, the input waveguide 21 is coupled to one port at the one side of the optical coupler 23, and the bus waveguide 20C of the ring resonator filter 20 is coupled to one of two ports at the other side of the optical coupler 23 and the output waveguide 22 is coupled to the other one of the two ports at the other side of the optical coupler 23. In particular, the input waveguide 21 is coupled to the optical device 4 of any of the first embodiment and the modifications thereto described above through the optical coupler 23 and the ring resonator filter 20. Further, the input waveguide 21 is coupled to the output waveguide 22 through the optical coupler 23. Here, the optical coupler 23 is, for example, a directional coupler or a multi-mode interference coupler. It is to be noted that the optical coupler 23 is referred to also as output optical coupler.

It is to be noted that the ring resonator filter 20, input waveguide 21, output waveguide 22 and optical coupler 23 may be formed on the BOX layer 6 by etching the SOI layer 7 provided at the SOI substrate 8 similarly to the optical device 4 of any of the first embodiment and the modifications thereto described above. In particular, the optical device 4 of any of the first embodiment and the modifications thereto described above, ring resonator filter 20, input waveguide 21, output waveguide 22 and optical coupler 23 are formed on the same silicon substrate 5. Therefore, the ring resonator filter 20 is referred to also as silicon ring resonator filter. Further, the input waveguide 21 is referred to also as silicon input waveguide. Meanwhile, the output waveguide 22 is referred to also as silicon output waveguide. Further, the optical coupler 23 is referred to also as silicon optical coupler.

Accordingly, the optical device 40 according to the present embodiment includes the optical device 4 (for example, refer to FIGS. 1, 5, 9 to 12) of any of the first embodiment and the modifications thereto described above. Therefore, the optical device 40 is advantageous in that the diffraction grating 3 configuring a distributed Bragg reflection mirror that has a Bragg wavelength as originally designed in the configuration including the silicon waveguide core 1 similarly as in the case of the first embodiment described above can be implemented with a high yield.

Further, as depicted in FIG. 14, the hybrid laser 30 according to the present embodiment includes the optical device 40 described above, a gain medium 31 and a reflection mirror 32. It is to be noted that the hybrid laser 30 is referred to also as silicon hybrid laser or laser light source.

Here, the gain medium 31 performs light emission and light amplification and is, for example, a semiconductor optical amplifier (SOA). The SOA 31 is optically coupled to the input waveguide 21 of the optical device 40 described hereinabove. In particular, the SOA 31 is optically coupled to the optical device 40 described above, for example, by butt optical coupling or fiber optical coupling. It is to be noted that the gain medium 31 is referred to also as light emitting device. Further, the SOA 31 is referred to also as light emitting device for which a chemical compound semiconductor is used.

Further, the reflection mirror 32 is configured from a high reflection film formed on one end face of the SOA 31. In particular, the high reflection film 32 that functions as a reflection mirror is provided at the one end face of the SOA 31 while a non-reflection film 33 is provided at the other end face of the SOA 31.

The reflection mirror 32 is provided at the opposite side to the distributed Bragg reflection mirror configured from the diffraction grating 3 across the silicon waveguide core 1, ring resonator filter 20, optical coupler 23 and SOA 31 of the optical device 40 described above, and configures a laser cavity. In other words, the laser cavity is configured from the distributed Bragg reflection mirror configured from the diffraction grating 3 and the reflection mirror 32, and the silicon waveguide core 1, ring resonator filter 20, optical coupler 23 and SOA 31 are provided in the laser cavity.

In the present hybrid laser 30 configured in such a manner as described above, only a wavelength component selected by the wavelength selection mechanism provided in the optical device 4 of any of the first embodiment and the modifications thereto described above from within light generated by the SOA 31 and having a wide wavelength region is repetitively amplified in the laser cavity to cause laser oscillation with a single wavelength. Then, part of the laser-oscillated light is guided by the output waveguide 22 through the optical coupler 23 and then is outputted to the outside.

Particularly, since the present hybrid laser 30 includes the optical device 4 of the first embodiment and the modifications thereto described above, namely, the reflection type optical filter device, light of a transmission peak wavelength outputted from the SOA 31 and passing through the ring resonator filter 20 is inputted to the silicon waveguide including the silicon waveguide core 1 of the optical device 4 of any of the first embodiment and the modifications thereto described above. Then, the light propagated in the silicon waveguide transits with a high efficiency from the silicon waveguide to the dielectric waveguide including the dielectric waveguide core 2 in the transition region 9 in which the silicon waveguide core 1 is formed in a taper shape. Then, substantially all of the optical power transfers to the fundamental mode of the dielectric waveguide at the terminal end of the transition region 9. Then, the mode shape is stabilized in the coupling region 10, and then only an optical component having a wavelength corresponding to the Bragg wavelength of the distributed Bragg reflection mirror is reflected by the diffraction grating 3 configuring the distributed Bragg reflection mirror provided at the dielectric waveguide. In other words, one of the transmission peak wavelengths of the ring resonator is selected and reflected by the distributed Bragg reflection mirror. Then, the reflected light propagates in the reverse direction in the dielectric waveguide and transits to the silicon waveguide in the transition region 9, and then propagates in the reverse direction in the silicon waveguide until it returns to the ring resonator filter 20. On the other hand, the remaining light components that are not reflected by the distributed Bragg reflection mirror advance straightforwardly in the dielectric waveguide and are widely spread here in the horizontal direction by the tapered portion 2X. Then, the light components are irradiated to the outside at the terminal end (device end portion) of the dielectric waveguide. Here, since the unnecessary optical components undergo end face reflection after they are widely spread, they do not return to the silicon waveguide. It is to be noted here that, while the dielectric waveguide core 2 includes the tapered portion 2X, the configuration is not limited to this, and the dielectric waveguide core 2 may be configured so as not to include the tapered portion 2X as in the first embodiment and the modifications thereto described hereinabove or may be configured so as to include the oblique end face 2Y.

Figure 15:
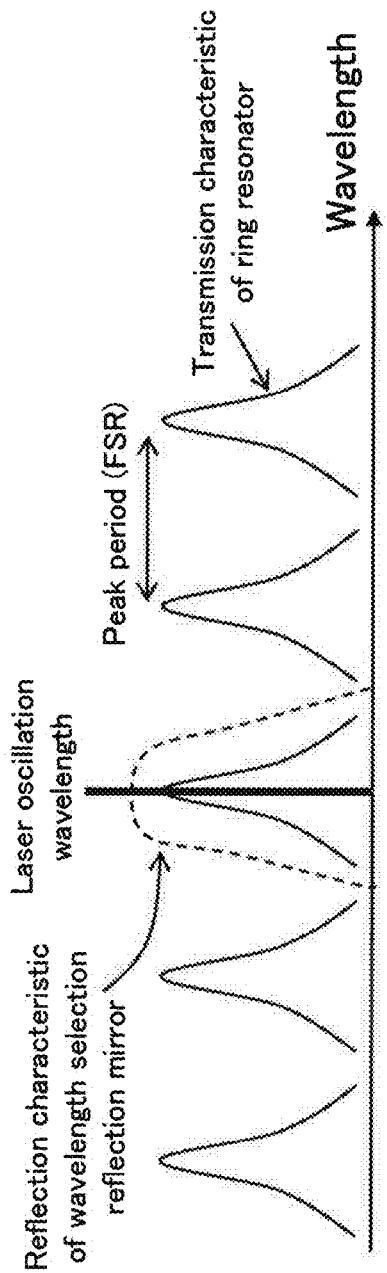
FIG. 15 is a view illustrating laser oscillation in a single wavelength by wavelength selection by a wavelength selection mechanism included in the hybrid laser according to the second embodiment.

Incidentally, in order to obtain an oscillation wavelength as originally designed in the hybrid laser 30 configured in such a manner as described above, one of the transmission peak wavelengths in the transmission characteristic of the ring resonator filter 20 is made coincide with a reflection wavelength band in the reflection characteristic of the wavelength selection reflection mirror 4 with high accuracy as depicted in FIG. 15.

Figure 16:
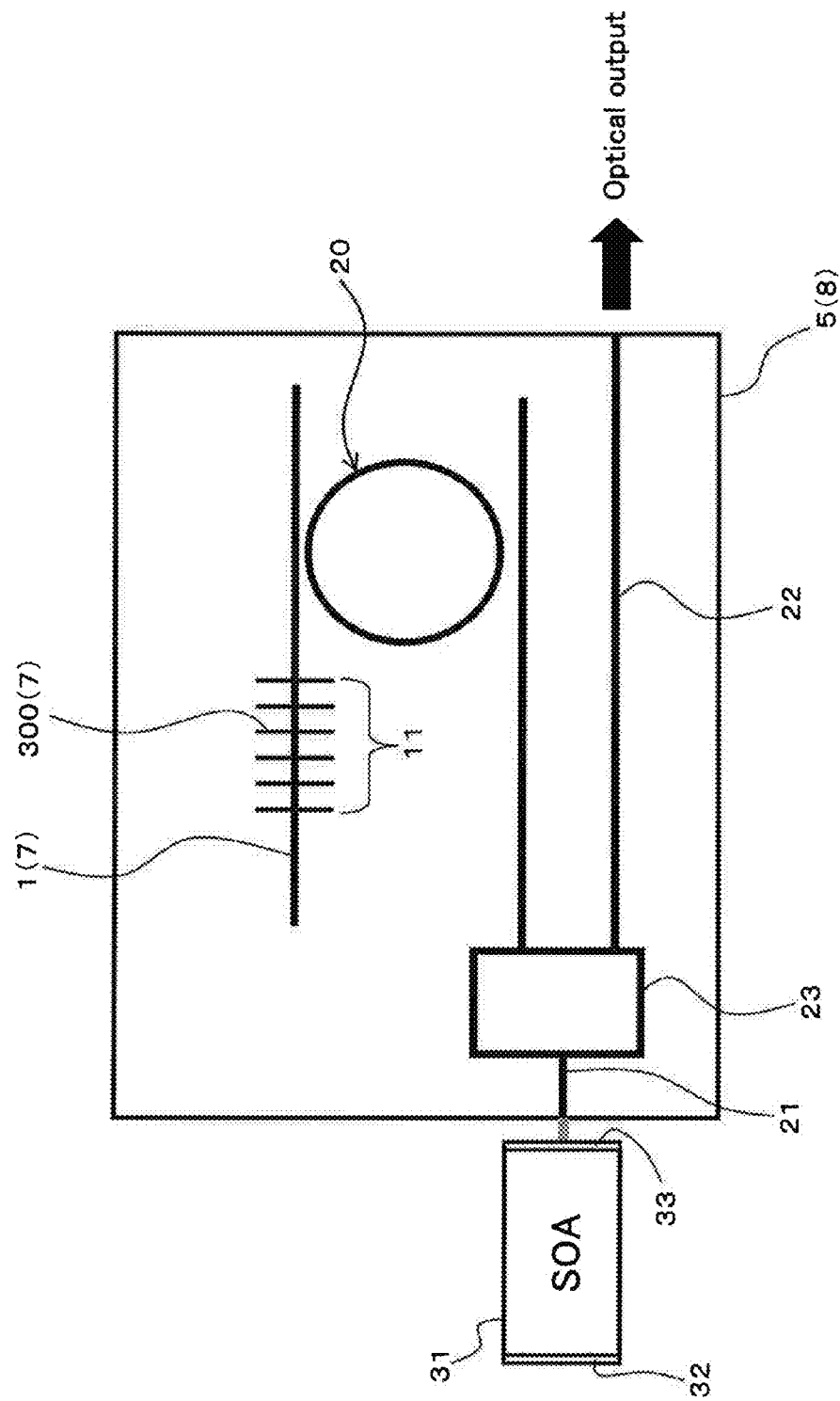
FIG. 16 is a schematic top plan view depicting a configuration of a hybrid laser of a comparative example.

For example, it seems a possible idea to use, as the wavelength selection reflection mirror, a distributed Bragg reflection mirror configured by periodically varying the width of the silicon waveguide core 1 to form a diffraction grating 300 from portions projecting from the side faces of the silicon waveguide core 1 as depicted in FIG. 16. It is to be noted that the example depicted in FIG. 16 is referred to as hybrid laser of a comparative example.

Figure 17A:
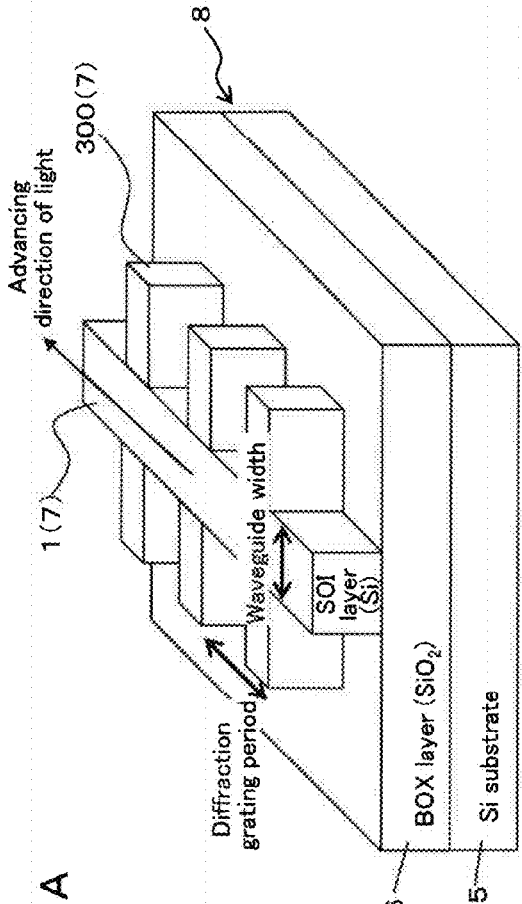
FIG. 17A is a schematic perspective view depicting a silicon waveguide core having a side wall diffraction grating configuring a distributed Bragg reflection mirror included in the hybrid laser of the comparative example.

In particular, it seems a possible idea to etch the SOI layer (Si layer) 7 having, for example, a thickness of approximately 250 nm on the BOX layer 6 ($SiO_2$ layer) provided at the SOI substrate 8 to periodically modulate the width of the silicon waveguide core 1 to form the silicon waveguide core 1 having the side wall diffraction grating 300 as depicted in FIG. 17A. Here, the silicon waveguide core 1 and the diffraction grating 300 are approximately 250 nm high and the period of the diffraction grating is approximately 300 nm.

Here, the reflection center wavelength (Bragg wavelength $\lambda_B$) of the distributed Bragg reflection mirror is represented by an expression of $\lambda_B = 2n_{eq}\Lambda$ using the equivalent refractive index $n_{eq}$ of the waveguide and the period $\Lambda$ of the diffraction grating.

Further, since the period $\Lambda$ of the diffraction grating depends upon the accuracy of a mask used in etching, it is very uniform on the wafer and also is high in reproducibility. However, the equivalent refractive index $n_{eq}$ of the waveguide varies much depending upon the width or the thickness of the silicon waveguide core 1.

Figure 17C:
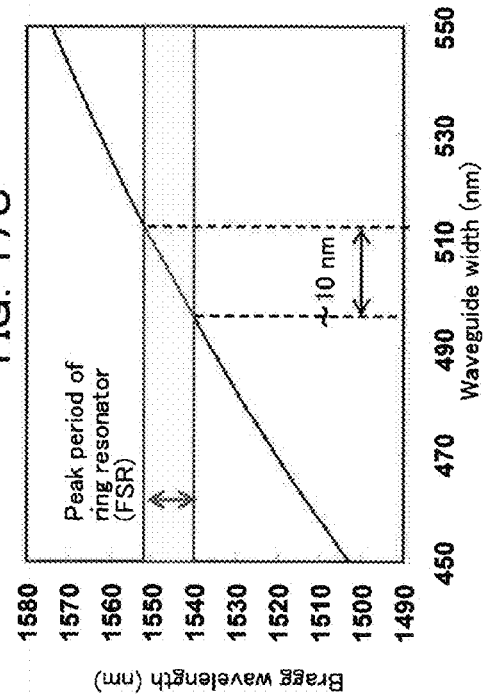
FIG. 17C is a view depicting a waveguide width dependency of a Bragg wavelength in the distributed Bragg reflection mirror region.
Figure 17B:
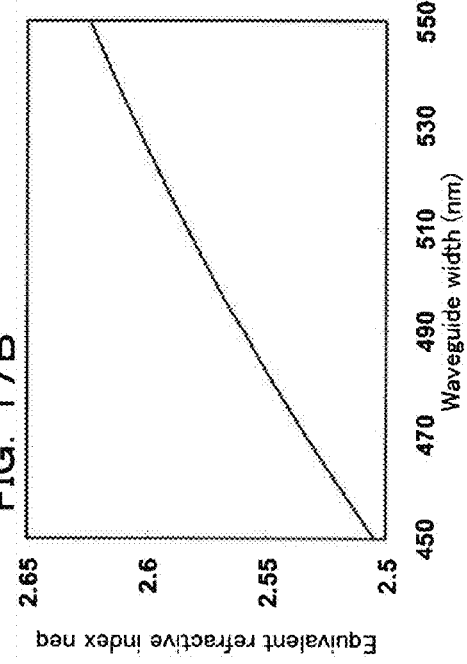
FIG. 17B is a view depicting a waveguide width dependency of an equivalent refractive index of a waveguide in the distributed Bragg reflection mirror region of the comparative example.

FIG. 17B depicts a waveguide width dependency of the equivalent refractive index of the waveguide in the distributed Bragg reflection mirror region 11 of the comparative example. FIG. 17C depicts a waveguide width dependency of the Bragg wavelength of the distributed Bragg reflection mirror region 11. It is to be noted that the dependency of the waveguide upon the TE mode is depicted in FIGS. 17B and 17C. Here, the waveguide width signifies the width of the silicon waveguide core 1.

As depicted in FIG. 17B, the equivalent refractive index of the waveguide has a high dependency upon the width (waveguide width) of the silicon waveguide core 1 configuring the waveguide, and the equivalent refractive index varies by approximately 0.5% in accordance with a variation of the waveguide width of approximately 10 nm. In particular, the equivalent refractive index of the waveguide including the silicon waveguide core 1 has a high waveguide width dependency with which the equivalent refractive index varies by a great amount if the waveguide width is displaced only a little.

This is because the waveguide including the silicon waveguide core 1 has a very great refractive index difference between a core and a cladding and a very small cross section size of the waveguide core in comparison with the other waveguides such as, for example, a silica-based glass waveguide or a semiconductor buried structure channel waveguide. In particular, since the waveguide including the silicon waveguide core 1 has a very great refractive index difference between a core and a cladding and a very small cross section size of the waveguide core, the shape or the optical confinement coefficient of the optical waveguide mode varies in accordance with a very small variation of the waveguide width.

By such a high waveguide width dependency of the equivalent refractive index of the waveguide as described above, also the Bragg wavelength of the distributed Bragg reflection mirror, which has a proportional relationship with the equivalent refractive index of the waveguide, has a high waveguide width dependency.

As depicted in FIG. 17C, a Bragg wavelength shift substantially equal to a peak period (FSR) of the ring resonator is caused by a very small displacement of the wavelength width of approximately 15 nm. In particular, the Bragg wavelength of the distributed Bragg reflection mirror has a high waveguide width dependency with which, if the waveguide width is displaced only a little, then also the Bragg wavelength of the distributed Bragg reflection mirror varies by a great amount.

Therefore, in order to establish matching between a predetermined transmission peak wavelength of the ring resonator and the Bragg wavelength of the distributed Bragg reflection mirror, waveguide core size control of very high accuracy of approximately several nm, which exceeds a process accuracy at present, is required. Therefore, it is difficult to achieve such wavelength matching in stability. Further, if wavelength matching between a predetermined transmission peak wavelength of the ring resonator and the Bragg wavelength of the distributed Bragg reflection mirror cannot be established, then oscillation with a wavelength that is not assumed originally occurs or simultaneous laser oscillation with a plurality of peak wavelengths occurs. Therefore, it is difficult to configure the hybrid laser.

It is to be noted here that, while the description is given taking the dependency of the waveguide upon the TE mode as an example, also the dependency of the waveguide upon the TM mode exhibits a similar tendency. Further, while the description here is given taking the waveguide width dependency of the Bragg wavelength as an example, the Bragg wavelength has a high structure dependency also upon the thickness of the waveguide or the thickness of the remaining SOI layer of a rib waveguide structure.

Where the distributed Bragg reflection mirror configured from the side wall diffraction grating 300 provided at the silicon waveguide core 1 is used as the wavelength selection reflection mirror in this manner, the reflection center wavelength of the distributed Bragg reflection mirror has a very high waveguide shape dependency. Therefore, it is difficult to obtain a Bragg wavelength as originally designed in stability with the process accuracy at present, and where the disturbed Bragg reflection mirror is applied to a hybrid laser, significant degradation of the laser characteristic occurs.

Therefore, the present hybrid laser 30 includes the optical device 4 of any of the first embodiment and the modifications thereto described above, namely, the reflection type optical filter device, as described above. Thus, one of the periodical transmission peak wavelengths of the ring resonator filter 20 is selected with certainty by the reflection type optical filter device 4.

Accordingly, the hybrid laser according to the present embodiment includes the optical device 4 (refer to, for example, FIGS. 1, 9 to 12) of any of the first embodiment and the modifications thereto described above. Therefore, the hybrid laser is advantageous in that the diffraction grating 3 configuring the distributed Bragg reflection mirror that has a Bragg wavelength as originally designed can be implemented with a high yield in the optical device 4 including the silicon waveguide core 1 similarly as in the case of the first embodiment described above. Therefore, it becomes possible to form the diffraction grating 3 configuring the distributed Bragg reflection mirror having a Bragg wavelength as originally designed in stability with the process accuracy at present, and it becomes possible to improve the laser characteristic of the hybrid laser 30.

It is to be noted that the foregoing description of the embodiment is given taking, as an example, a case wherein the optical device 4 (refer to, for example, FIGS. 1, and 9 to 12) in which the silicon waveguide core 1 including the tapered portion 1X is provided only at one side of the diffraction grating 3 configuring the distributed Bragg reflection mirror along the light propagation direction from among the optical devices 4 of the first embodiment and the modifications thereto described above (for example, refer to FIGS. 1, 5, and 9 to 13) is applied to the hybrid laser. However, the application is not limited to this.

For example, the optical device 4 (refer to, for example, FIG. 13) in which the silicon waveguide cores 1 and 1A including the tapered portions 1X and 1XA are provided at both sides of the diffraction grating 3 configuring the distributed Bragg reflection mirror along the light propagation direction from among the optical devices 4 (for example, refer to FIGS. 1, 5 and 9 to 13) of the first embodiment and the modifications thereto described hereinabove can be applied also to the hybrid laser.

Figure 18:
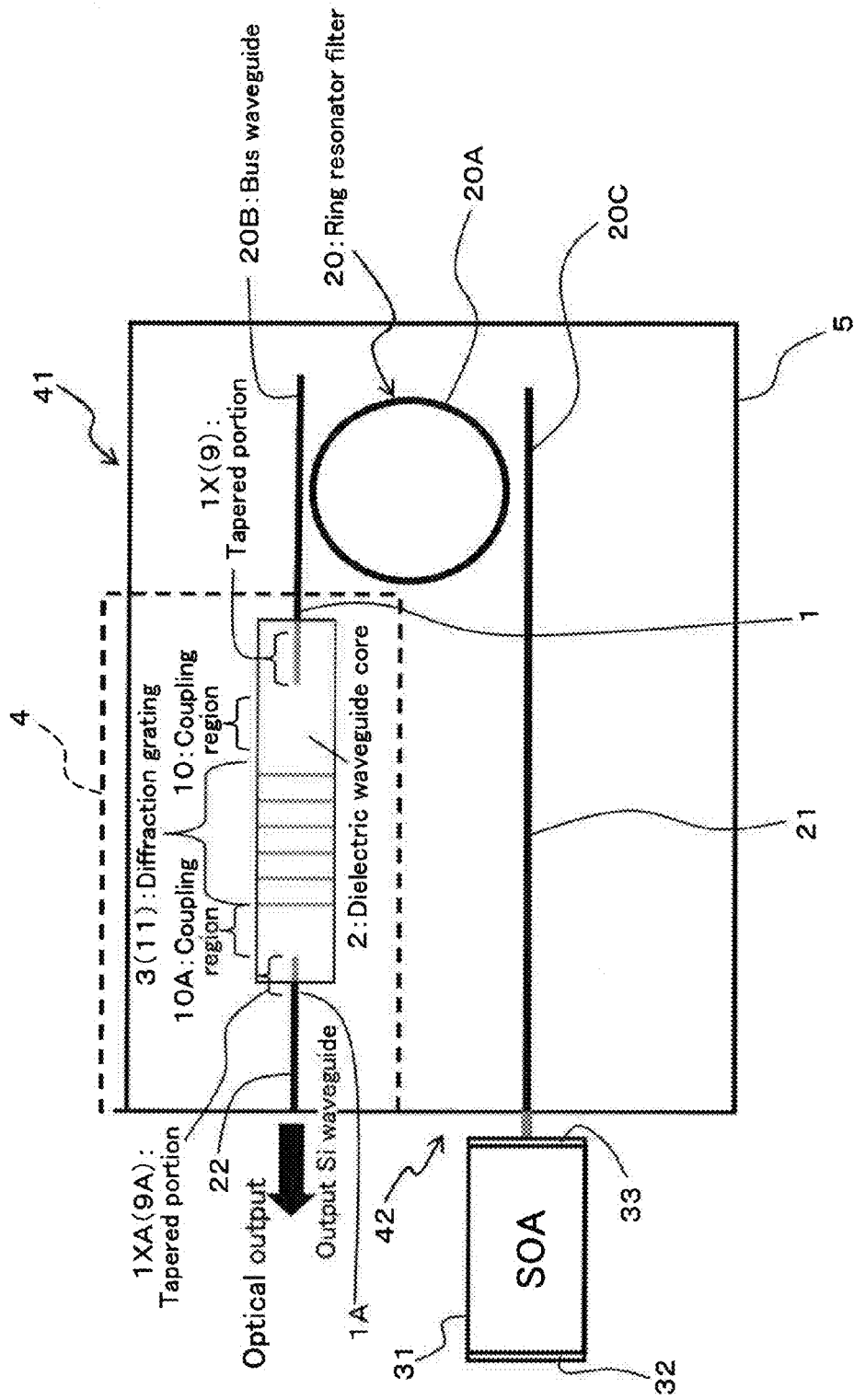
FIG. 18 is a schematic top plan view depicting a configuration of an optical device and a hybrid laser according to a modification to the second embodiment.

In this case, as depicted in FIG. 18, an optical device 41 may be configured as an optical integrated device including a ring resonator filter 20, an input waveguide 21 and an output waveguide 22 in addition to the components of the optical device 4 (for example, refer to FIG. 13) of the modification to the first embodiment described above. The peak reflectance of the distributed Bragg reflection mirror provided in the optical device 4 (for example, refer to FIG. 13) of the modification to the first embodiment described above may be set, for example, to approximately 10 to 50%. Further, the bus waveguide 20B of the ring resonator filter 20 may be coupled to the silicon waveguide configured from the silicon waveguide core 1 at one side of the optical device 4 (for example, refer to FIG. 13) of the modification to the first embodiment described above and the other bus waveguide 20C may be coupled to the input waveguide 21. In other words, the optical device 4 (for example, refer to FIG.

13) of the modification to the first embodiment described above may be coupled to one side of the ring resonator filter 20 and the input waveguide 21 may be coupled to the other side of the ring resonator filter 20. Further, the output waveguide 22 may be coupled to the silicon waveguide configured from the silicon waveguide core 1A at the other side of the optical device 4 (for example, refer to FIG. 13) of the modification to the first embodiment described above. It is to be noted that, since, in the configuration just described, the distributed Bragg reflection mirror configured from the diffraction grating 3 has also a function as the optical coupler 23 in the embodiment described above, the optical coupler 23 may not be provided between the ring resonator filter 20 and the SOA 31.

A hybrid laser 42 including such an optical device 41 as described above includes the optical device 4 (for example, refer to FIG. 13) of the modification to the first embodiment described above, a gain medium (SOA) 31 and a reflection mirror 32 as depicted in FIG. 18. Further, the silicon waveguide core 1, ring resonator filter 20 and SOA 31 are provided in a laser cavity that is configured from the distributed Bragg reflection mirror configured from the diffraction grating 3 and the reflection mirror 32.

In the hybrid laser 42 of the present modification configured in such a manner as just described, only a wavelength component selected by the wavelength selection mechanism configured from the optical device 4 (for example, refer to FIG. 13) of the modification to the first embodiment described above and the ring resonator filter 20 from within light generated by the SOA 31 and having a wide wavelength region is repetitively amplified in the laser cavity such that laser oscillation with a single wavelength occurs. Then, part of the laser-oscillated light is guided in the output waveguide 22 through the silicon waveguide core 1A at the other side of the optical device 4 (for example, refer to FIG. 13) of the modification to the first embodiment described above and then is outputted to the outside. In particular, since the peak reflectance of the distributed Bragg reflection mirror included in the optical device 4 (for example, refer to FIG. 13) of the modification to the first embodiment described above is set, for example, to approximately 10 to 50% as described hereinabove, part of the light having a wavelength corresponding to the Bragg wavelength of the distributed Bragg reflection mirror returns to the SOA 31 side and contributes to the laser oscillation. The remaining part of the light is extracted to the output waveguide 22 side and then is used as a laser output. In this manner, in the hybrid laser 42 of the present modification, the distributed Bragg reflection mirror is configured so as to have a half mirror function for reflecting part of the wavelength component corresponding to the Bragg wavelength but passing the remaining part of the wavelength component therethrough.

Especially, since the hybrid laser 42 of the present modification includes the optical device 4 (for example, refer to FIG. 13) of the modification to the first embodiment described above, light of the transmission peak wavelength outputted from the SOA 31 and passing through the ring resonator filter 20 is inputted to the silicon waveguide including the silicon waveguide core 1 of the optical device 4 (for example, refer to FIG. 13) of the modification to the first embodiment described above. Then, the light propagated in the silicon waveguide transits with a high efficiency from the silicon waveguide to the dielectric waveguide including the dielectric waveguide core in the transition region 9 in which the silicon waveguide core 1 is formed in the taper shape. Then, substantially all light power transfers to the fundamental mode of the dielectric waveguide at the terminal end of the transition region 9. Then, the mode shape is stabilized in the coupling region 10 and then part of the light of a wavelength corresponding to the Bragg wavelength of the distributed Bragg reflection mirror is reflected by the diffraction grating 3 configuring the distributed Bragg reflection mirror provided at the dielectric waveguide. Then, the reflected light propagates in the reverse direction in the dielectric waveguide and transits back to the silicon waveguide in the transition region 9, and then propagates in the reverse direction in the silicon waveguide until it returns to the ring resonator filter 20. On the other hand, the remaining part of the light of the wavelength corresponding to the Bragg wavelength of the distributed Bragg reflection mirror advances straightforwardly in the dielectric waveguide without being reflected by the diffraction grating 3 configuring the distributed Bragg reflection mirror. Then, the light transits with a high efficiency from the dielectric waveguide to the silicon waveguide in the transition region 9A in which the silicon waveguide core 1X is formed in a taper shape, and then substantially all light power transfers to the fundamental mode of the silicon waveguide at the terminal end of the transition region 9A. Then, the light propagates in the silicon waveguide and is outputted to the outside through the output waveguide 22.

It is to be noted that the present invention is not limited to the configurations of the embodiment and the modification thereto specifically described above, and variations and modifications can be made without departing from the scope of the present invention. For example, the configuration of the hybrid laser or the optical device used for the hybrid laser is not limited to those of the embodiment and the modifications thereto described above, and a configuration with which the optical device of any of the first embodiment and the modification thereto described above can be applied may be adopted.

Third Embodiment

Now, an optical transmission device, an optical reception device and an optical transmission apparatus according to a third embodiment are described with reference to FIG. 19.

As depicted in FIG. 19, the optical transmission device according to the present embodiment includes a plurality of optical devices 4 (for example, refer to FIGS. 1, 5 and 9 to 12) of any of the first embodiment and the modifications thereto described above as wavelength selection reflection mirrors. The optical transmission device further includes a plurality of ring resonator filters 20, a plurality of input waveguides 21, a plurality of optical couplers 23, a plurality of ring optical modulators 51, an optical multiplexer 52 and an output waveguide 53. In particular, the present optical transmission device 50 is an optical integrated device in which the optical devices 4 (for example, refer to FIGS. 1, 5 and 9 to 12) of any of the first embodiment and the modifications thereto described above, ring resonator filters 20, input waveguides 21, optical couplers 23, ring optical modulators 51, optical multiplexer 52 and output waveguide 53 are integrated on the silicon substrate 5. Here, the optical transmission device 50 includes four optical devices 4 (for example, refer to FIGS. 1, 5 and 9 to 12) of any of the first embodiment and the modifications thereto described above, four ring resonator filters 20, four input waveguides 21, four optical couplers 23, and four ring optical modulators 51. Consequently, the optical transmission device 50 multiplexes and outputs, as WDM signal light, four signal lights having four wavelengths λ1 to λ4. It is to be noted that the optical transmission device 50 is referred to also as optical functional device, optical communication device, optical integrated device, WDM optical transmission device, WDM optical communication device or WDM optical integrated device.

It is to be noted that the present optical transmission device 50 can be regarded as an optical integrated device which includes a plurality of optical devices 40 (for example, refer to FIG. 14) of any of the second embodiment and the modifications thereto described above and further includes a plurality of ring optical modulators 51, an optical multiplexer 52 and an output waveguide 53.

Here, the optical devices 4 (for example, refer to FIGS. 1, 5 and 9 to 12) of any of the first embodiment and the modifications thereto described above are used to select one of the periodical transmission peak wavelengths of the ring resonator filter 20. Therefore, each of the optical devices 4 (for example, refer to FIGS. 1, 5 and 9 to 12) of any of the first embodiment and the modifications thereto described above is referred to also as wavelength selection reflection mirror. Further, a set of a wavelength selection reflection mirror 4 and a ring resonator filter 20 is referred to also as wavelength selection mechanism or wavelength filter. In the present embodiment, the diffraction gratings 3 provided in the optical devices 4 have periods (pitches) Λ1 to Λ4 different from each other and Bragg wavelengths of the distributed Bragg reflection mirrors different from each other.

The plurality of ring resonator filters 20 are coupled one by one to the silicon waveguides configured from the silicon waveguide cores 1 provided in the plurality of optical devices 4. Each of the ring resonator filters 20 includes the ring waveguide 20A and the two bus waveguides 20B and 20C provided at both sides across the ring waveguide 20A. The bus waveguide 20B is coupled to the silicon waveguide configured from the silicon waveguide core 1 of the optical device 4 (for example, refer to FIGS. 1, 5 and 9 to 12) of any of the first embodiment and the modifications thereto described above, and the bus waveguide 20C is coupled to the optical coupler 23. Here, the ring resonator filters 20 are designed commonly.

The plurality of input waveguides 21 are coupled one by one to the plurality of optical couplers 23.

The plurality of optical couplers 23 are coupled one by one to the plurality of ring resonator filters 20. To one port at one side of each of the optical couplers 23, one input waveguide 21 is coupled. Further, to one of two ports at the other side of each of the optical couples 23, the other bus waveguide 20C of one ring resonator filter 20 is coupled, and to the other one of the two ports at the other side of each of the optical couplers 23, one ring optical modulator 51 is coupled. In other words, each input waveguide 21 is coupled to the optical device 4 (for example, refer to FIGS. 1, 5 and 9 to 12) of any of the first embodiment and the modifications thereto described hereinabove through an optical coupler 23 and a ring resonator filter 20. Further, the input waveguides 21 are coupled to the ring optical modulators 51 through the optical couplers 23. Here, each optical coupler 23 is, for example, a directional coupler or a multi-mode interference coupler. It is to be noted that the optical coupler 23 is referred to also as output optical coupler.

The plurality of ring optical modulators 51 are coupled one by one to the plurality of optical couplers 23. In particular, the plurality of ring optical modulators 51 are coupled one by one to the plurality of optical devices 4. Each of the ring optical modulators 51 is a ring resonator type optical modulator that includes a ring waveguide 51A and a bus waveguide 51B.

The optical multiplexer 52 is coupled to the plurality of ring optical modulators 51 and multiplexes signal lights. For example, the optical multiplexer 52 is, for example, an array waveguide diffraction grating (AWG) type multiplexer, a non-symmetric Mach Zehnder interferometer type multiplexer, a ring type multiplexer or an Echelle diffraction grating type multiplexer.

The output waveguide 53 is coupled to the optical multiplexer 52 and WDM signal light is outputted to the outside through the output waveguide 53.

It is to be noted that the ring resonator filters 20, input waveguides 21, output waveguide 53, optical couplers 23, ring optical modulators 51 and optical multiplexer 52 may be formed on the BOX layer 6 by etching the SOI layer 7 provided at the SOI substrate 8 similarly as in the optical devices 4 (for example, refer to FIGS. 1, 5 and 9 to 12) of the first embodiment and the modifications thereto described hereinabove. In other words, the optical devices 4 (for example, refer to FIGS. 1, 5 and 9 to 12) of any of the first embodiment and the modifications thereto described hereinabove, ring resonator filters 20, input waveguides 21, output waveguide 53, optical couplers 23, ring optical modulators 51 and optical multiplexer 52 are formed on the same silicon substrate 5. Therefore, the optical transmission device 50 is referred to also as silicon device, silicon optical transmission device, silicon optical communication device, silicon optical integrated device, WDM silicon optical transmission device, WDM silicon optical communication device or WDM silicon optical integrated device. Further, the ring resonator filter 20 is referred to also as silicon ring resonator filter. Further, each input waveguide 21 is referred to also as silicon input waveguide. Further, the output waveguide 53 is referred to also as silicon output waveguide. Further, each optical coupler 23 is referred to also as silicon optical coupler. Further, each ring optical modulator 51 is referred to also as silicon ring optical modulator. Further, the optical multiplexer 52 is referred to also as silicon optical multiplexer.

The optical transmission device 50 according to the present embodiment includes the optical devices 4 (for example, refer to FIGS. 1, 5, and 9 to 12) of any of the first embodiment and the modifications thereto described above. Accordingly, the optical transmission device is advantageous in that the diffraction grating 3 configuring the distributed Bragg reflection mirror having a Bragg wavelength as originally designed can be implemented with a high yield in the optical transmission device 50 that includes the silicon waveguide core 1 similarly as in the case of the first embodiment described above.

Further, as depicted in FIG. 19, an optical transmission apparatus 54 according to the present embodiment includes the optical transmission device 50, a gain medium array 55 and a reflection mirror 56. It is to be noted that the optical transmission apparatus 54 is referred to also as optical transmitter, optical communication apparatus, WDM optical transmission apparatus or WDM optical communication apparatus.

Here, the gain medium array 55 is optically coupled to the optical transmission device 50 described above and includes a plurality of gain mediums 58. Here, each of the gain mediums 58 performs light emission and optical amplification and is, for example, a semiconductor optical amplifier (SOA). Therefore, the gain medium array 55 is referred to also as SOA array. Here, the SOA array 55 is a 4-ch SOA array in which four SOAs 58 are integrated. In particular, the SOA array 55 is a 4-ch SOA array that includes four waveguides and includes an SOA 58 in each waveguide. Each SOA 58 is optically coupled to each input waveguide 21 of the optical transmission device 50 described above. In particular, the SOA array 55 is optically coupled to the optical transmission device 50 described above, for example, by butt optical coupling or fiber optical coupling. It is to be noted that the gain medium 58 is referred to also as light emitting device. Further, the SOA 58 is referred to also as light emitting device for which a chemical compound semiconductor is used. Further, the SOA array 55 is referred to also as light emitting device array.

The reflection mirror 56 is configured from a high reflection film at one end face of the SOA array 55. In particular, the high reflection mirror 56 that functions as a reflection mirror is provided at the one end face of the SOA array 55, and an anti-reflection film 57 is provided at the other end face of the SOA array 55.

The reflection mirror 56 is provided at the opposite side to a plurality of distributed Bragg reflection mirrors provided in the above-described optical transmission device 50 across the SOA array 55, and configures a laser cavity. In particular, the reflection mirror 56 is provided at the opposite side to the distributed Bragg reflection mirrors, each configured from the diffraction grating 3, across the silicon waveguide cores 1, ring resonator filters 20, optical couplers 23 and SOAs 58 of the optical transmission device 50 described hereinabove, and configures the laser cavity. The laser cavity is configured from the distributed Bragg reflection mirrors each configured from the diffraction grating 3 and the reflection mirror 56, and the silicon waveguide cores 1, ring resonator filters 20, optical couplers 23 and SOAs 58 are provided in the laser cavity.

It is to be noted that the present optical transmission apparatus 54 can be regarded also as an optical transmission apparatus that includes a plurality of (here, four) hybrid lasers 30 (for example, refer to FIG. 14) of any of the second embodiment and the modifications thereto described hereinabove and further includes the plurality of (here, four) ring optical modulators 51 coupled to the hybrid lasers 30, the optical multiplexer 52 and the output waveguide 53. In this case, the hybrid layers 30 have oscillation wavelengths different from one another.

In the present optical transmission apparatus 54 configured in such a manner as described above, in the laser cavities, namely, in the hybrid lasers, only wavelength components selected by the wavelength selection mechanisms configured from the optical devices 4 (refer to, for example, FIGS. 1, 5 and 9 to 12) of any of the first embodiment and the modifications thereto described hereinabove and the ring resonator filters 20 from within light of a wide wavelength region generated by the SOAs 58 are repetitively amplified in the laser cavities to cause laser oscillation each with a single wavelength. In particular, in the diffraction gratings 3 of the optical devices 4 provided in the optical transmission apparatus 54, the periods Λ1 to Λ4 are different from one another and the Bragg wavelengths of the distributed Bragg reflection mirrors are different from one another as described hereinabove. Therefore, the distributed Bragg reflection mirrors as the wavelength selection reflection mirrors select peak wavelengths different from one another from among periodical transmission peak wavelengths of the ring resonator filters 20, and laser oscillation occur with the wavelengths λ1 to λ4 different from one another, which are spaced from each other by a fixed interval in the laser cavities. Part of the lights laser-oscillated by each laser cavity are outputted to the ring optical modulators 51 through the optical couplers 23. Then, the fixed intensity (CW) signal lights generated by the laser cavities are data-modulated by the ring optical modulators 51 and multiplexed by the optical multiplexer 52 and then outputted as WDM signal light from the single output waveguide 53 to the outside. It is to be noted that the propagation of light in the laser cavities is similar to that in the case of the second embodiment and the modification thereto described hereinabove.

Accordingly, the optical transmission device and the optical transmission apparatus according to the present embodiment are advantageous in that, since they include the optical devices 4 (refer to, for example, FIGS. 1, 5 and 9 to 12) of any of the first embodiment and the modifications thereto described hereinabove, the diffraction gratings 3 each including the silicon waveguide core 1 and configuring a distributed Bragg reflection mirror having a Bragg wavelength as originally designed can be implemented with a high yield similarly as in the case of the first embodiment described hereinabove. Therefore, similarly as in the case of the second embodiment and the modifications thereto described hereinabove, it becomes possible to stably form the diffraction grating 3 that configures a distributed Bragg reflection mirror having a Bragg wavelength as originally designed with a process accuracy at present. Consequently, the optical transmission apparatus 54 can be formed with an improved laser characteristic.

It is to be noted that the configuration of the optical transmission device and the optical transmission apparatus that include the optical devices 4 (refer to, for example, FIGS. 1, 5 and 9 to 12) of any of the first embodiment and the modifications thereto described hereinabove is not limited to that of the embodiment described above.

For example, as depicted in FIG. 20, an optical transmission device 60 may be configured such that it includes a plurality of optical devices 4 (refer to, for example, FIGS. 1, 5 and 9 to 12) of any of the first embodiment and the modifications thereto described above as wavelength selection reflection mirrors and further includes the plurality of ring optical modulators 51 coupled one by one to the plurality of optical devices 4, the optical multiplexer 52 coupled to each of the plurality of ring optical modulators 51, and the output waveguide 53 coupled to the optical multiplexer 52. In other words, also it is possible to configure an optical transmission device without the provision of the plurality of input waveguides 21, the plurality of optical couplers 23 and the plurality of ring resonator filters 20, which configure the optical transmission device 50 of the embodiment described hereinabove.

In this case, end faces of the dielectric waveguide cores 2 of the optical devices 4 (refer to, for example, FIGS. 1, 5 and 9 to 12) of any of the first embodiment and the modifications thereto described hereinabove may be exposed to an input side end face of the optical transmission device 60 such that lights from the SOAs 58 configuring the SOA array 55 may be inputted from the end faces of the dielectric waveguide cores 2. The SOA array 55 may be optically coupled to the optical transmission device 60 such that the SOAs 58 configuring the SOA array 55 are optically coupled to the end faces of the dielectric waveguide cores 2 of the optical devices 4 provided in the optical transmission device 60 of the present modification. Here, since the sizes of the end faces of the dielectric waveguide cores 2 and the optical guide modes are approximately 3 to 4 µm and are consistent with each other, high efficiency optical coupling can be implemented, for example, by butt coupling. It is to be noted, however, that, in this case, the distributed Bragg reflection mirror provided in each of the optical devices 4 (refer to, for example, FIGS. 1, 5 and 9 to 12) of any of the first embodiment and the modifications thereto described hereinabove is used as a wavelength filter (reflection selection reflection mirror) that reflects only a particular wavelength (channel). Further, the silicon waveguide configured from the silicon waveguide core 1 of each optical device 4 (refer to, for example, FIGS. 1, 5 and 9 to 12) of any of the first embodiment and the modifications thereto described hereinabove may be coupled to a ring optical modulator 51. With such a configuration as just described, each of the SOAs 58 is provided in each laser cavity configured from a reflection mirror configured from the high reflection film 56 formed at one end face of the SOA array 55 and the distributed Bragg reflection mirror configured from the diffraction grating 3 provided in the optical device 4 (refer to, for example, FIGS. 1, 5 and 9 to 12) of any of the first embodiment and the modifications thereto described hereinabove. In this case, the optical transmission apparatus of the present modification includes a plurality of hybrid lasers, each of which includes the optical device 4 (refer to, for example, FIGS. 1, 5 and 9 to 12) of any of the first embodiment and the modifications thereto described hereinabove, the gain medium (SOA) 58 optically coupled to the optical device 4, and the reflection mirror 56 provided at the opposite side to the diffraction grating 3 configuring the distributed Bragg reflection mirror across the gain medium 58 and configuring a laser cavity.

In the optical transmission apparatus 61 of the present modification configured in such a manner as described above, in each of the laser cavities, namely, in each of the hybrid lasers, only wavelength components corresponding to Bragg wavelengths (reflection peak wavelengths) of the distributed Bragg reflection mirrors provided in the optical devices 4 (refer to, for example, FIGS. 1, 5 and 9 to 12) of any of the first embodiment and the modifications thereto described hereinabove from within light of a wide wavelength region generated by the SOAs 58 are reflected and then repetitively amplified in the laser cavities to cause laser oscillation each with a single wavelength. In particular, in the diffraction gratings 3 of the optical devices provided in the optical transmission apparatus 61 of the present modification, the periods $\Lambda 1$ to $\Lambda 4$ are different from one another and the Bragg wavelengths of the distributed Bragg reflection mirrors are different from one another. Therefore, laser oscillation occur with the wavelengths $\lambda 1$ to $\lambda 4$ different from one another in the laser cavities. Especially, since the peak reflectance of the distributed Bragg reflection mirror provided in the optical device 4 (refer to, for example, FIGS. 1, 5 and 9 to 12) of the modification to the first embodiment described hereinabove is set, for example, to approximately 50%, part of light of a wavelength corresponding to the Bragg wavelength of the distributed Bragg reflection mirror is reflected by the diffraction grating 3 that configures the distributed Bragg reflection mirror and returns to the SOA 58 side and therefore contributes to laser oscillation. Meanwhile, the remaining part of the light advances straightforwardly in the dielectric waveguide without being reflected by the diffraction grating 3 that configures the distributed Bragg reflection mirror. Then, the remaining part of the light transits with a high efficiency from the dielectric waveguide to the silicon waveguide in the transition region 9 in which the silicon waveguide core 1 has a taper shape, and almost all optical power thereof transfers to the fundamental mode of the silicon waveguide at the terminal end of the transition region 9. Then, the remaining part of the light propagates in the silicon waveguide and is extracted as a laser output to the ring optical modulator 51 side. In this manner, in the optical transmission apparatus 61 of the present modification, the distributed Bragg reflection mirror configured from the diffraction grating 3 is configured so as to have a half mirror function that reflects part of a wavelength component corresponding to the Bragg wavelength but passes the remaining part of the wavelength component therethrough. Further, the fixed intensity (CW) signal lights generated by the laser cavities are data-modulated by the ring optical modulators 51 and multiplexed by the optical multiplexer 52 and then outputted as WDM signal light from the common output waveguide 53 to the optical transmission path 62 such as, for example, an optical fiber.

Further, while the foregoing description of the embodiment and the modifications thereto described above is given taking, as an example, a case in which the optical device 4 (refer to, for example, FIGS. 1, 5 and 9 to 12) in which the silicon waveguide core 1 including the tapered portion 1X is provided at only one side of the diffraction grating 3 configuring the distributed Bragg reflection mirror along the light propagation direction from among the optical devices 4 (refer to, for example, FIGS. 1, 5 and 9 to 12) of the first embodiment and the modifications thereto described hereinabove is applied to the optical transmission device and the optical transmission apparatus, the present invention is not limited to this.

For example, also it is possible to apply, from among the optical devices 4 (refer to, for example, FIGS. 1, 5 and 9 to 12) of the first embodiment and the modifications thereto described hereinabove, the optical device 4 (for example, FIG. 13) in which the silicon waveguide cores 1 and 1A including the tapered portions 1X and 1XA, respectively, are provided at both sides of the diffraction grating 3 configuring the distributed Bragg reflection mirror along the light propagation direction to the optical reception device 70 as depicted in FIG. 20. It is to be noted that the optical reception device is referred to also as optical function device, optical communication device, optical integrated device, WDM optical reception device, WDM optical communication device, WDM optical integrated device or optical reception apparatus. Also it is possible to combine the optical reception device with the optical transmission apparatus (for example, FIG. 20) of the modification to the embodiment described above to configure an optical communication system 80. It is to be noted that also it is possible combine the optical reception device 70 with the optical transmission apparatus (for example, FIG. 19) of the embodiment described above to configure an optical communication system.

In this case, as depicted in FIG. 20, the optical reception device 70 may include a Mach-Zehnder interferometer 75 having two arms (optical waveguides) 73 and 74 between two optical couplers 71 and 72. Each of the two arms 73 and 74 may include the optical device 4 (for example, FIG. 13) of the modification to the first embodiment described hereinabove. The optical reception device 70 may further include a first optical detector 76 coupled to one of the two optical couplers 71 and 72, an optical demultiplexer 77 coupled to the other one of the two optical couplers 71 and 72, and a second optical detector 78 coupled to the optical demultiplexer 77.

Here, an input waveguide 79 is coupled to one of ports of the optical coupler 71 at the input side of the Mach-Zehnder interferometer 75, and one first optical detector 76 is coupled to the other port of the optical coupler 71. Further, the optical demultiplexer 77 is coupled to one of ports of the optical coupler 72 at the output side of the Mach-Zehnder interferometer 75. Further, a plurality of (here, three) second optical detectors 78 are coupled to the optical demultiplexer 77. The optical devices 4 (for example, FIG. 13) of the modification to the first embodiment described hereinabove which have diffraction grating periods equal to each other and have a peak reflectance of approximately 100% are provided at both arms 73 and 74 of the Mach-Zehnder interferometer 75. The Mach-Zehnder interferometer 75 in which the optical devices 4 (for example, FIG. 13) of the modification to the first embodiment described hereinabove are provided at both arms 73 and 74 thereof in this manner functions as a wavelength separator 81 that separates WDM signal light, in which a plurality of (here, four) different wavelengths $\lambda 1$ to $\lambda 4$ are multiplexed, into a signal light of the one wavelength $\lambda 1$ and signal lights of a plurality of (here, three) wavelengths $\lambda 2$ to $\lambda 4$. It is to be noted that the two optical couplers 71 and 72 are two-input two-output optical couplers (2×2 optical couplers) and are, for example, directional couplers or multi-mode interference couplers. Further, the optical demultiplexer 77 is, for example, an array waveguide diffraction grating (AWG) type demultiplexer, an asymmetric Mach-Zehnder interferometer type multiplexer, a ring type multiplexer, an Echelle diffraction grating type multiplexer or the like.

It is to be noted that the Mach-Zehnder interferometer 75 and the optical demultiplexer 77 may be formed on the BOX layer 6 by etching the SOI layer 7 provided at the SOI substrate 8 similarly to the optical device 4 (for example, FIG. 13) of the modification to the first embodiment described hereinabove. Further, the first optical detector 76 and the second optical detectors 78 may be formed, for example, by crystal growth of a Ge layer on the SOI layer 7 before the SOI layer 7 is etched. In particular, the first optical detector 76 and the second optical detector 78 can be formed by forming a Ge layer on the SOI layer 7 and then performing etching to work the Ge layer into a shape of a waveguide. In this case, the Ge layer functions as a light absorbing layer that converts light into carriers. In this manner, the optical devices 4 (for example, FIG. 13) of the modification to the first embodiment described hereinabove, Mach-Zehnder interferometer 75, optical demultiplexer 77, first optical detector 76 and second optical detectors 78 are provided on the same silicon substrate 5. Therefore, the optical reception device 70 is referred to also as silicon device, silicon optical reception device, silicon optical communication device, silicon optical integrated device, WDM silicon optical reception device, WDM silicon optical communication device or WDM silicon optical integrated device. Further, the Mach-Zehnder interferometer 75 is referred to also as silicon Mach-Zehnder interferometer. Further, the optical demultiplexer 77 is referred to also as silicon optical demultiplexer.

In the optical reception device 70 configured in such a manner as described above, WDM signal light transmitted through the optical transmission path 62 such as, for example, an optical fiber and including a plurality of (here, four) different wavelengths $\lambda 1$ to $\lambda 4$ multiplexed therein is inputted to the wavelength separator 81 through the input waveguide 79. Then, in the wavelength separator 81, only a signal light of a wavelength (channel; here $\lambda 1$) corresponding to the period of the diffraction grating 3 is reflected by the distributed Bragg reflection mirror included in each of the optical devices 4 provided at the arms 73 and 74, and is outputted from the other port of the optical coupler 71 at the input side and detected by the first optical detector 76. Meanwhile, the signal lights of the other wavelengths (channels; here $\lambda 2$ to $\lambda 4$) pass as they are through the two arms 73 and 74 of the Mach-Zehnder interferometer 75 and extracted from the one port of the optical coupler 72 at the output side. Then, the extracted signal lights of the other wavelengths are demultiplexed by the optical demultiplexer 77 and detected individually by the second optical detectors 78 for the individual wavelengths.

In this manner, the optical device 4 (for example, FIG. 13) of the modification to the first embodiment described hereinabove can be used also as the wavelength separator 81.

It is to be noted that the present invention is not limited to the configurations described in connection with the embodiments and the modifications thereto described above but can be modified in various manners without departing from the subject matter of the present invention. For example, the configurations of the optical transmission device, optical reception device and optical transmission apparatus are not limited to those of the embodiments and the modifications thereto described hereinabove, but may be those only if the optical device of any of the first embodiment and the modifications thereto described hereinabove can be applied to them.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. An optical device, comprising:
   a silicon waveguide core having a tapered portion having a sectional size that decreases toward a terminal end portion thereof;
   a dielectric waveguide core contiguous to the silicon waveguide core while covering at least the tapered portion, the dielectric waveguide core having a refractive index lower than that of the silicon waveguide core and configuring a single-mode waveguide; and
   a diffraction grating provided at a region, in which the silicon waveguide core does not exist, of a dielectric waveguide including the dielectric waveguide core and configuring a distributed Bragg reflection mirror, the diffraction grating not being in contact with the silicon waveguide core; wherein
   the diffraction grating is configured from a silicon film having a refractive index greater than that of the dielectric waveguide core and is provided on the same plane as that of the silicon waveguide core.

2. The optical device according to claim 1, further comprising a transition region including the tapered portion, a distributed Bragg reflection mirror region including the diffraction grating and a coupling region that couples the transition region and the distributed Bragg reflection mirror region to each other.

3. The optical device according to claim 1, wherein the diffraction grating projects to the outer side of the dielectric waveguide core.

4. The optical device according to claim 1, further comprising a cladding layer having a refractive index lower than that of the dielectric waveguide core and provided so as to cover the dielectric waveguide core.

5. The optical device according to claim 1, further comprising:
a different silicon waveguide core having a tapered portion having a sectional size that decreases toward a terminal end portion thereof; wherein
the different silicon waveguide core is provided at the opposite side to the silicon waveguide core across the diffraction grating such that the terminal end portion of the different silicon waveguide core is placed at the diffraction grating side; and
the dielectric waveguide core covers at least the tapered portion of the different silicon waveguide core.

6. An optical reception device, comprising:
a Mach-Zehnder interferometer having two arms between two optical couplers;
the optical device according to claim 5 provided at each of the two arms;
a first optical detector coupled to one of the two optical couplers;
an optical demultiplexer coupled to the other one of the two optical couplers; and
a second optical detector coupled to the optical demultiplexer.

7. The optical device according to claim 1, wherein the dielectric waveguide core has a tapered portion having a sectional size that increases toward a terminal end portion thereof at the opposite side to the silicon waveguide core across the diffraction grating.

8. The optical device according to claim 1, wherein an end face of the dielectric waveguide core at the opposite side to the silicon waveguide core across the diffraction grating is inclined obliquely with respect to a light propagation direction.

9. The optical device according to claim 1, further comprising a ring resonator filter coupled to a silicon waveguide configured from the silicon waveguide core.

10. A hybrid laser, comprising:
the optical device according to claim 9;
a gain medium optically coupled to the optical device; and
a reflection mirror provided at the opposite side to the distributed Bragg reflection mirror across the silicon waveguide, ring resonator filter and gain medium and configuring a laser cavity.

11. A hybrid laser, comprising:
the optical device according to claim 1;
a gain medium optically coupled to the optical device; and
a reflection mirror provided at the opposite side to the distributed Bragg reflection mirror across the gain medium and configuring a laser cavity.

12. An optical transmission device, comprising:
a plurality of optical devices according to claim 1;
a plurality of ring optical modulators coupled one by one to the plurality of optical devices;
an optical multiplexer coupled to each of the plurality of ring optical modulators; and
an output waveguide coupled to the optical multiplexer.

13. The optical transmission device according to claim 12, further comprising:
a plurality of ring resonator filters coupled one by one to silicon waveguides configured from the silicon waveguide cores provided in the plurality of optical devices; and
a plurality of optical couplers coupled one by one to the plurality of ring resonator filters; wherein
the plurality of ring optical modulators are coupled one by one to the plurality of optical couplers.

14. An optical transmission apparatus, comprising:
the optical transmission device according to claim 12;
a gain medium array optically coupled to the optical transmission device and including a plurality of gain mediums; and
a reflection mirror provided at the opposite side to the plurality of distributed Bragg reflection mirrors provided at the optical transmission device across the gain medium array, the reflection mirror configuring a laser cavity.

15. An optical device, comprising:
a silicon waveguide core having a tapered portion having a sectional size that decreases toward a terminal end portion thereof;
a dielectric waveguide core contiguous to the silicon waveguide core while covering at least the tapered portion, the dielectric waveguide core having a refractive index lower than that of the silicon waveguide core and configuring a single-mode waveguide; and
a diffraction grating provided at a region, in which the silicon waveguide core does not exist, of a dielectric waveguide including the dielectric waveguide core and configuring a distributed Bragg reflection mirror, the diffraction grating not being in contact with the silicon waveguide core;
wherein the diffraction grating is configured by periodically varying the sectional size of the dielectric waveguide core.

16. The optical device according to claim 15, wherein the diffraction grating is configured from a portion of the dielectric waveguide core projecting from a side face of the dielectric waveguide core.

17. The optical device according to claim 15, wherein the diffraction grating is configured from a concave portion of an upper face of the dielectric waveguide core.

* * * * *

UNITED STATES PATENT AND TRADEMARK OFFICE
CERTIFICATE OF CORRECTION

PATENT NO. : 9,620,931 B2  
APPLICATION NO. : 14/470553  
DATED : April 11, 2017  
INVENTOR(S) : Shinsuke Tanaka Page 1 of 1

It is certified that error appears in the above-identified patent and that said Letters Patent is hereby corrected as shown below:

On the Title Page

On the Left hand Column, the Related U.S. Application Data should be listed as shown below:

-- Item (63) Continuation of application No. PCT/JP2012/058635, filed on Mar. 30, 2012 --

Signed and Sealed this  
Twelfth Day of September, 2017

Joseph Matal  
*Performing the Functions and Duties of the*  
*Under Secretary of Commerce for Intellectual Property and*  
*Director of the United States Patent and Trademark Office*